United States Patent
Pinai

(10) Patent No.: US 6,405,164 B1
(45) Date of Patent: Jun. 11, 2002

(54) AUDIO COMPRESSION CIRCUIT AND METHOD

(75) Inventor: Hoang Minh Pinai, San Jose, CA (US)

(73) Assignee: Engineering Consortium, Inc., Santa Clara, CA (US)

( * ) Notice: Subject to any disclaimer, the term of this patent is extended or adjusted under 35 U.S.C. 154(b) by 0 days.

(21) Appl. No.: 09/475,801

(22) Filed: Dec. 30, 1999

(51) Int. Cl.$^7$ .............................................. G10L 19/00
(52) U.S. Cl. ........................ 704/225; 704/500; 381/23.1
(58) Field of Search .................................. 704/500, 225; 381/23.1, 26, 28, 55, 106; 330/250, 254, 278, 267

(56) References Cited

U.S. PATENT DOCUMENTS

| | | | |
|---|---|---|---|
| 3,848,194 A | * 11/1974 | Nishimura et al. ............ 330/29 |
| 4,151,469 A | 4/1979 | Frutiger ..................... 325/38 R |
| 4,170,720 A | 10/1979 | Killion .................... 179/107 R |
| 4,689,819 A | 8/1987 | Killion ......................... 381/68 |
| 4,718,099 A | 1/1988 | Hotvet ...................... 381/68.4 |
| 4,823,392 A | 4/1989 | Walker ....................... 381/106 |
| 4,882,761 A | 11/1989 | Waldhauer .................. 381/106 |
| 4,882,762 A | 11/1989 | Waldhauer .................. 381/106 |
| 4,934,770 A | 6/1990 | Anderson et al. ........... 330/278 |
| 4,996,712 A | 2/1991 | Laurence et al. .......... 381/68.4 |
| 5,128,566 A | 7/1992 | Killion et al. ............... 307/567 |
| 5,144,675 A | 9/1992 | Killion et al. ............. 381/68.4 |
| 5,216,379 A | * 6/1993 | Hamley ....................... 330/267 |
| 5,272,394 A | 12/1993 | Kirk et al. .................... 307/351 |
| 5,278,912 A | 1/1994 | Waldhauer ................. 381/68.4 |
| 5,402,494 A | 3/1995 | Flippe et al. .............. 381/69.2 |
| 5,402,498 A | 3/1995 | Waller, Jr. .................. 381/106 |
| 5,550,923 A | 8/1996 | Hotvet ......................... 381/72 |
| B14,592,087 A | 8/1996 | Killion ......................... 381/68 |
| 5,602,925 A | 2/1997 | Killion ...................... 381/68.4 |
| 5,822,442 A | 10/1998 | Agnew et al. .............. 381/107 |
| 5,832,097 A | 11/1998 | Armstrong et al. ......... 381/321 |

* cited by examiner

*Primary Examiner*—Tälivaldis Ivars Šmits
*Assistant Examiner*—Daniel Abebe
(74) *Attorney, Agent, or Firm*—Coudert Brothers LLP

(57) ABSTRACT

An audio compressor utilizes a switched charging state rectifier which produces an output proportional to the magnitude of an input signal but with controlled attack/release times. The rectified voltage is input to a logical selector, which provides logical control signals which are a function of the rectified voltage. In a preferred embodiment, the control signals of the logical selector are used to select the switch positions of a switched resistor ladder. The switched resistor ladder is used to provide a resistance path in an op-amp feedback amplifier, thereby enabling the gain of the op-amp amplifier to be adjusted in steps by the selector as the rectified signal level varies.

30 Claims, 27 Drawing Sheets

| FIG. 13A |
| FIG. 13B |

AUDIO COMPRESSION CIRCUIT AND METHOD

FIELD OF THE INVENTION

The present invention relates generally to compressor circuits for audio signals. More particularly, the present invention relates to audio compressors for hearing aids.

BACKGROUND OF THE INVENTION

Audio compressors are devices that are commonly used to modify the dynamic range of an audio signal. Generally, an audio compressor comprises an amplifier and a control system to control the gain of the amplifier as a function of the input and/or output signal strength. An audio compressor circuit reduces the gain of an amplifier at high input signal levels to prevent distortion which would otherwise occur when the input signal exceeds a threshold level. However, audio compressors also provide other useful benefits.

Commonly, an audio compressor is characterized in terms of a compression ratio, which is the ratio of the gain at a reference signal level divided by the gain at a specified higher signal level. For example, an audio compressor with a 3:1 compression ratio has the characteristic that each 3 dB increase in sound level beyond a threshold level results in a 1 dB increase in output. However, more generally an audio compressor may be characterized in terms of a compression function that defines a relationship between input signal strength and the differential gain of the amplifier.

A variety of common sounds, such as the clang of a bell, have a sound amplitude with a high initial amplitude which decays over time. It is desirable that a compressor reduce gain rapidly enough that the amplification of such sounds does not cause unpleasant distortion and/or an excessive sound-level. However, a highly unnatural sound results if the gain recovers to its ordinary level too rapidly after an initial loud sound. Consequently, the transient response of a compressor has a large impact on the sound quality. Audio compressors are characterized in terms of an "attack" time, the time it takes for the amplifier to stabilize to within about 1 dB of its final increased value after a sudden increase in input audio level and a "release" time associated with the time it takes for an audio compressor to return to within about 1 dB of its final decreased value after the input audio level has decreased to normal levels. Typically, it is desirable that an audio compressor have a release time that is much longer than its attack time. Typical release times are often in the range of 1–10 milliseconds. Typical attack times are in the range of 0–1 milliseconds.

Audio compressors are commonly used in hearing aids. One reason that audio compressors are used in hearing aids is that hearing loss is often dependent upon both the sound frequency and the audio level. The ability to hear high frequency sounds may, for example, depend upon whether or not the listener is in a quiet or noisy environment. Typically less amplification is required if the background audio level is high. Thus, the required amplification will depend upon both the sound frequency and the audio level. An audio compressor that varies the amplification as a function of input audio level is thus useful for those types of hearing losses for which the input audio level determines the required amplification.

Audio compressors are also used in hearing aids to reduce distortion. The human ear is very sensitive to harmonic distortion. As is well known in the field of amplifier design, there is typically a preferred range of input signal levels for which low-noise linear amplification is possible for a particular Class-A, Class-AB, Class-B, or Class-D amplifier circuit. An output amplifier that is driven close to its maximum power output typically produces substantial harmonic distortion as the amplifier gain becomes saturated.

The design of an audio compressor for a miniature hearing aid is constrained by several design considerations that are unique to miniature hearing aids. First, a miniature hearing aid is typically powered by a single miniature hearing aid battery, which provides a nominal 1.5 VDC and which is capable of only limited load currents. High performance microprocessor circuits, by way of comparison, typically operate at a voltage of 3.3 VDC. Second, total circuit size is a major concern in the design of a hearing aid, since modem miniature hearing aids are designed to fit partially or totally in the ear canal. Third, cost is an issue. While high performance hearing aids sell for several thousand dollars, there is a world-wide mass market for hearing aids with a price of less than about two-hundred dollars. Moreover, since the total cost to a user includes audiologist fees, it is desirable that the characteristics of the hearing aid may be quickly adjusted to accommodate the user's needs and preferences.

Conventional audio compressors used in hearing aids commonly comprise an op-amp amplifier circuit whose gain is controlled by a current-controlled resistor. FIG. 1 is a circuit schematic of a prior art hearing aid circuit. A microphone 2 detects input sounds. An output amplifier stage 4 is used to provide large-signal amplification to provide an amplified signal to a speaker/transducer 6. A small signal amplifier and compression stage 8 includes an op-amp 16 with an input resistor 14 and a current-controlled resistor element 12. The compression function of small signal amplifier and compression stage 8 is achieved by gain control circuit 10 adjusting the resistance of current controlled resistor element 12 as a function of the audio signal input level. One common gain control circuit 10 uses the logarithmic current-voltage output of the collector-emitter current of a bipolar transistor in response to increasing base voltage in order to control the input currents to current controlled resistor element 12. However, there is only a limited current range over which a bipolar transistor has a current-voltage relationship that approximates a logarithmic function. Conventional current-controlled resistors also have numerous well-known limitations in regards to their accuracy and sensitivity.

There are several other drawbacks to the compressor circuit of FIG. 1, particularly when the audio compressor stage 8, output stage 4 and other electronics (not shown in FIG. 1) are fabricated on one integrated circuit. Bipolar transistors require a substantial circuit area compared to complimentary metal oxide semiconductor (CMOS) transistors. A hearing aid circuit fabricated using an all bipolar transistor process occupies a substantial circuit area, which increases its cost. Moreover, bipolar transistors consume more current and power than CMOS transistor circuits. While a mixed circuit fabrication process combining both CMOS transistors and bipolar transistors on one chip (commonly called a "bi-CMOS" process) is technically feasible, a bi-CMOS fabrication process is typically expensive compared to fabricating either an all-bipolar or all-CMOS circuit.

The function of small signal amplifier and compression stage 8 may also be implemented using a digital signal processing circuit (DSP). DSP circuits permit complex signal processing functions to be performed, permitting an arbitrary gain compression function to be achieved. However, DSP circuits typically comprise substantial memory, logic, and control circuit elements. A DSP circuit will tend to consume a substantial chip area and may draw a significant amount of current compared to the hearing aid output amplifier stage 4. Generally, utilizing a DSP circuit to perform an audio compression function for the output amplifier stage 4 of a hearing aid would substantially increase the size, cost, and complexity of a hearing aid circuit.

Unfortunately, conventional audio compressor circuits used in hearing aids tend to be expensive, requires a large area on an integrated circuit, and suffer from other problems, such as difficulties in providing control of audio compression over a wide range of audio input signal strengths. Moreover, most common audio compressor circuits provide only a limited ability to control and select the audio compression function.

What is desired is a new compressor circuit design approach that reduces the size, cost, and current requirements of an audio compressor circuit suitable for low voltage applications.

SUMMARY OF THE INVENTION

The present invention is generally directed towards an improved audio compressor in which a rectified input voltage is used by an impedance controller to produce an impedance which is a stepwise function of the rectified voltage. The present invention generally includes an improved low voltage rectifier and an impedance controller, which are preferably used together.

A preferred embodiment of the present invention generally comprises: an amplifier; a switched charging state rectifier producing an rectified voltage that is a function of the magnitude of an input signal with a controlled transient response, the switched charging rectifier including: a capacitor; a charging switch coupling the capacitor to a charging node; a discharge switch coupling the capacitor to a discharge node; a switch controller adjusting the operation of the switches so that the capacitor is charged when the voltage on said capacitor is less than the magnitude of an input voltage and discharged when the voltage on said capacitor is greater than the magnitude of the input voltage; and a current limiting element coupled to the discharging current path to limit the rate at which current may be discharged; and an impedance control circuit receiving as an input the rectified voltage of the switched charging state rectifier and providing a controlled impedance coupled to the amplifier to regulate the amplifier gain according to a compression function; wherein the capacitance of the capacitance and the electrical characteristics of said current limiting element are selected so that said compressor circuit has a preselected release time.

One aspect of the present invention is a compact selector circuit to convert the output of a rectifier into switch control signals to control an impedance selection circuit. In a preferred embodiment, a plurality of comparators whose reference voltages are set by a resistor voltage divider are used to convert the rectified voltage into logical signals to control the operation of a plurality of switches. In one embodiment, the outputs of the comparator are used to control the switch positions of a resistor ladder. In another embodiment, the logical signals are used to control the operation of current sources in a current matrix, with the output current of the current matrix used to regulate an impedance.

One object of the present invention is to provide an audio compressor with a controlled attack/release function.

Another object of the present invention is to provide an audio compressor that permits a plurality of compression ratios or functions to be selected.

Still another object of the present invention is to provide an audio compressor that is comparatively inexpensive.

DETAILED DESCRIPTION OF THE INVENTION

The present invention is directed towards audio compressors for hearing aids, although more generally the present invention may be used in other compressor applications.

Figure 1:
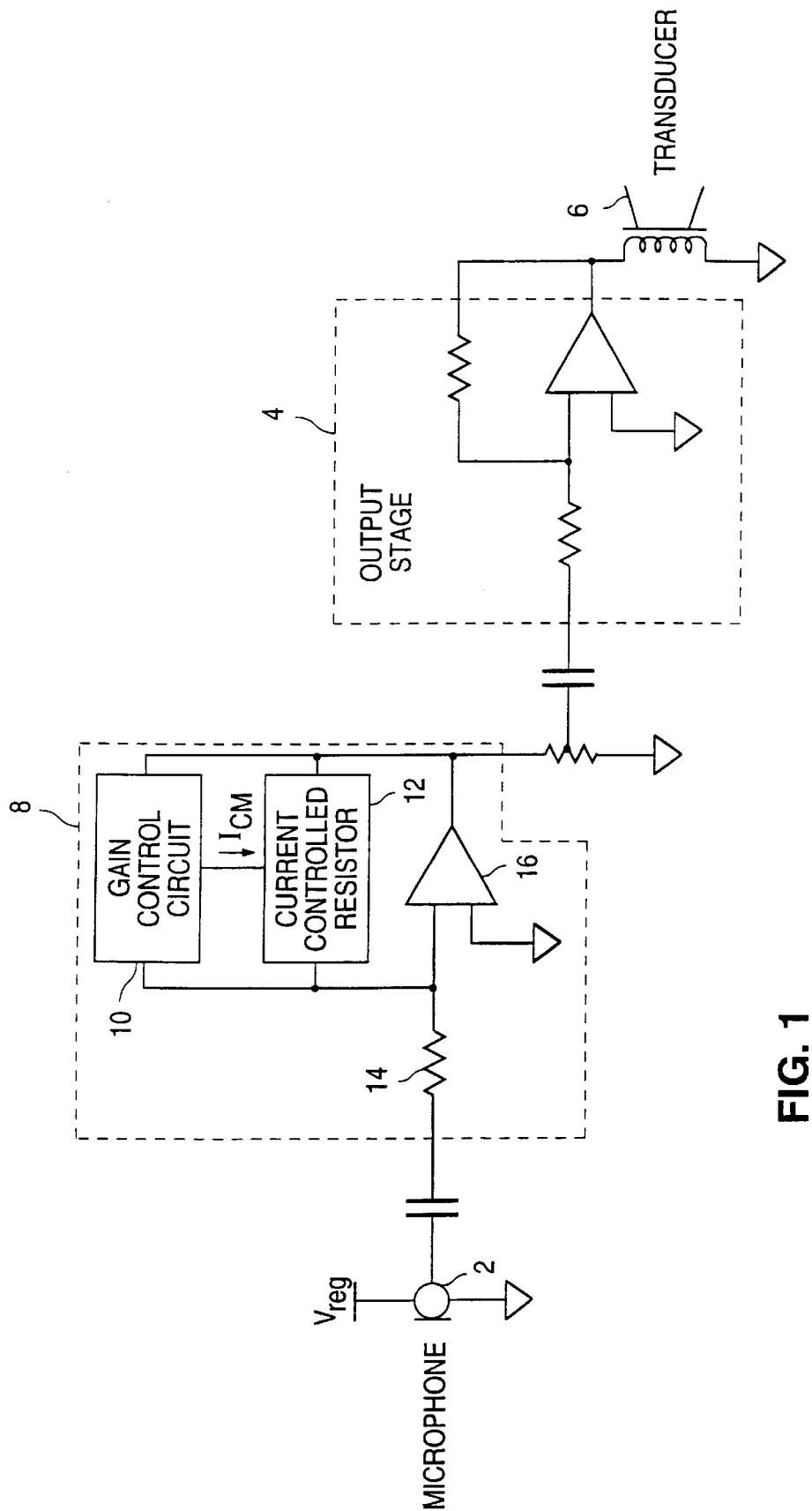
FIG. 1 is a schematic circuit diagram of a prior art hearing aid with an audio compressor.
Figure 2A:
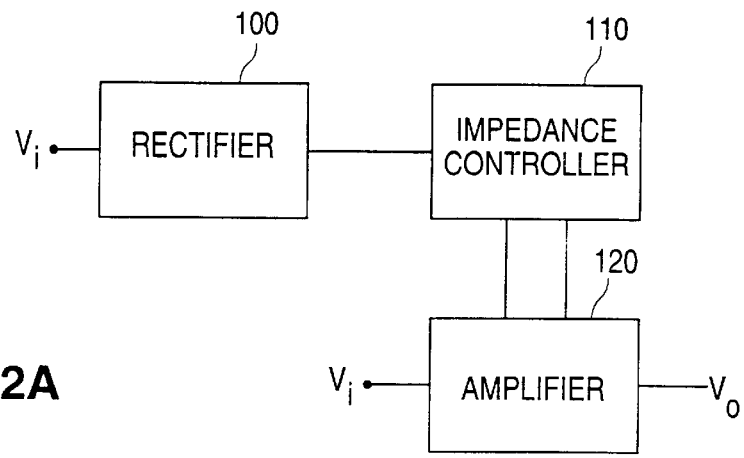
FIG. 2A is a block diagram of an audio compressor of the present invention comprising a rectifier, an impedance controller, and an impedance controlled amplifier.

FIG. 2A shows a block diagram illustrating some of the general principles of the present invention. A rectifier 100 produces an output voltage that is a function of the magnitude of an input voltage. In a preferred embodiment, the transient characteristics of rectifier 100 (i.e., its characteristic rise and fall response time to changes in the magnitude of the input voltage) are preselected. As described below in more detail, the inventors have developed an extremely sensitive low voltage rectifier which permits small decibel changes in input voltage level (i.e., sound level) to be resolved.

The output of rectifier 100 is coupled to an impedance controller 110. Impedance controller 110 has an output impedance that is a preselected stepwise function of the rectified voltage. As described below in more detail, in a preferred embodiment impedance controller 110 incorporates digital circuit elements which switch (i.e, adjust in steps) the output impedance as a function of the rectified voltage.

Figure 2B:
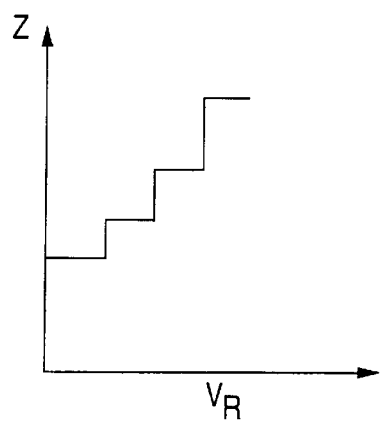
FIG. 2B is an illustrative plot showing an impedance which is a stepwise function of a rectified voltage.

The output impedance of impedance controller 110 is used to regulate the gain of an amplifier 120. Amplifier 120 may be any type of amplifier that has an output gain which is a function of an impedance, such as a feedback amplifier. FIG. 2B is an illustrative plot showing an output impedance, z, that is a stepwise function of the rectified voltage, Vr. By appropriate selection of the stepwise output impedance, z, of impedance controller 110 the output of amplifier 120 will approximate a continuous compression function, i.e., be a piecewise linear approximation of a continuously varying compression function. The inventor has recognized that for audio applications the compression function will approximate a continuous function to the human ear if the separation between compression steps is less than about one dB. For example, to approximate a compression function which smoothly varies over 40 dB impedance controller 110 should produce an impedance function that is a stepwise function of the rectified voltage with at least 40 steps. It will also be understood that the requirements of rectifier 100 will also depend upon the required number of steps and the voltage range of the input voltage, i.e., upon the smallest voltage that must be revolved.

Figure 2C:
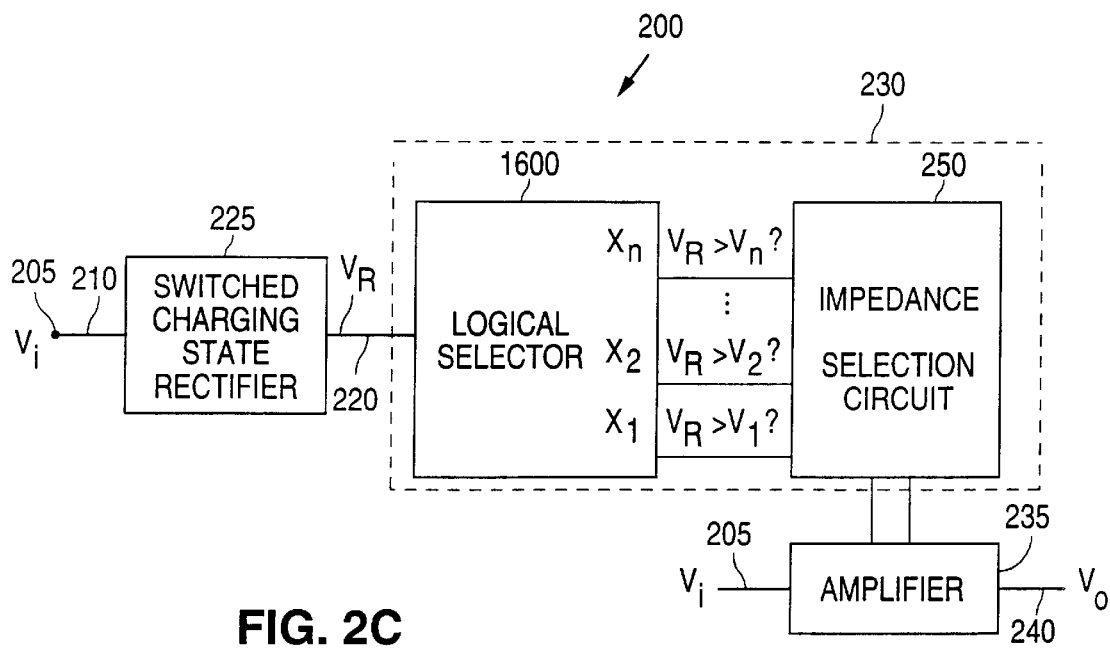
FIG. 2C is a block diagram of an audio compressor of the present invention comprising a time-sampling rectifier, amplifier impedance control circuit, and feedback amplifier with adjustable impedance element.

The preferred embodiments of the present invention generally comprise three main aspects. One aspect of the present application is a switched charging state rectifier 225 which is a novel rectification circuit that is extremely sensitive and which has a controllable transient response. In quasi-steady state operation, the magnitude of the output voltage 220 of switched charging state rectifier tracks the magnitude of the input voltage 210. However, if the input voltage rapidly changes in magnitude, the magnitude of the output voltage 220 of switched charging state rectifier has a characteristic transient rise/fall response. For example, in order to achieve a release time of five milliseconds, the output 220 should decay in response to a decrease in magnitude of the input signal 210 at a rate such that output 220 decays in five milliseconds to a value close to its final value (e.g., within one dB of its final value). FIG. 2C shows, in phantom, a generalized impedance control circuit 230 which converts a rectified voltage 220 into a controlled impedance which regulates the gain of an amplifier 235. Impedance control circuit 230 may be an conventional circuit that performs the function of converting a voltage into an impedance. However, conventional impedance control circuits 230 have a limited sensitivity and/or other drawbacks.

A second aspect of the present invention is a preferred inventive selector circuit 1600 to convert the rectified voltage 220 of switched charging state rectifier 225 into switch control signals to regulate the impedance of an impedance selection circuit 250 whose impedance may be selected by opening/closing a plurality of switches. All of the preferred embodiments of the present invention utilize a selector 1600 in combination with an impedance selection circuit since this provides superior control over an impedance to regulate the gain of an amplifier 235.

A third aspect of the present invention are compact, low-voltage impedance selection circuits designed to convert the selector outputs into an impedance that varies with signal strength according to a compression function. Preferred impedance control circuits include a switched resistor ladder and a switched current matrix.

Block schematic diagrams of various embodiments of an audio compressor 200 of the present invention are shown in FIGS. 2C–7. FIG. 2C shows the general block diagram of an audio compressor 200 of the present invention. A switched charging state rectifier 225 has an output 220 that is input into an impedance control circuit 230 which regulates the gain of an amplifier 235. As shown in FIG. 2, an input signal 205 enters audio compressor 200. A portion of input signal 205 is fed into input node 210 of switched charging state rectifier 225. Amplifier 235 also receives as an input signal 205. Input signal 205 may be supplied directly by a microphone but is preferably supplied in conjunction with well-known isolation and small-signal amplification elements. Impedance control circuit 230 may be implemented in a variety of ways, as indicated in FIGS. 3–7. Amplifier 235 may be any amplifier whose gain can be regulated by an impedance, but is preferably an op-amp feedback amplifier whose gain may be regulated by a variable resistance.

Switched charging state rectifier 225, which is shown in detail in FIGS. 8–13, is a device that produces an output that is a function of the magnitude of the input signal. Unlike an ideal rectifier, switched charging state rectifier 225 has a controllable transient response, implemented in the form of a selectable release function and/or attack function. Switched charging state rectifier 225 operates on the principle of comparing the magnitude of the input voltage to the voltage on a capacitor and making a logical decision to charge/discharge the capacitor. The charging and discharging current paths are selected so that the charging/discharging response of the capacitor produces an output voltage on the capacitor that increases/decreases in time according to a predetermined transient response function.

Switched charging state rectifier 225 produces an output that includes a preselected transient release/attack function. Since the time response is included in rectified voltage 220, a compression function that includes an attack/release response is achieved by coupling output voltage 220 to an impedance control circuit 230 to convert rectified voltage 220 into an impedance. Switched charging state rectifier 225 also has exceptional resolution, and can distinguish voltage differences of less than 250 micro-volts, which is desirable if the output voltage 220 is to be used to determine a gain compression function over a range of audio input levels. In particular, the sensitivity of switched charging state rectifier 225 permits a an input signal of less than about one volt to be resolved into a plurality of steps each corresponding to a less than one dB change in input signal.

Figure 3:
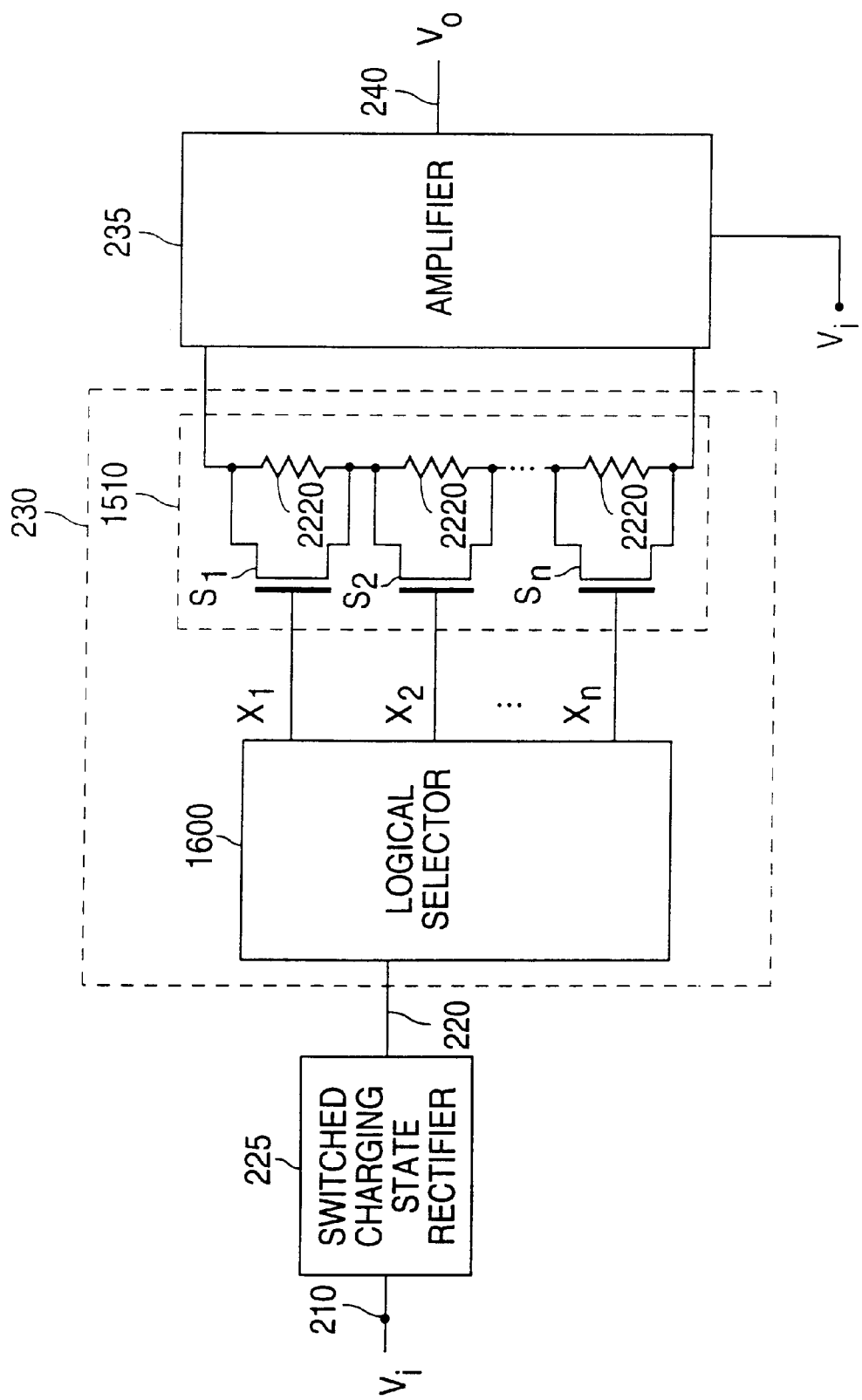
FIG. 3 is a schematic block circuit diagram of an embodiment of the inventive audio compressor in which an impedance ladder used to control the output gain of an amplifier.

FIG. 3 shows an embodiment of the audio compressor of FIG. 2 for which a preferred implementation is described in more detail with respect to FIGS. 17–21. A switched charging state rectifier 225 provides a rectified voltage output 220 that is input to a selector 1600. Selector 1600 provides a plurality of comparator outputs $X_1, X_2, \ldots X_N$, each of which has a pre-selected trigger voltage coupled to switches $S_1, S_2, \ldots S_N$ of impedance ladder 1510. Impedance elements 2220 are preferably resistors arranged in accord with any parallel or series resistor ladder configuration in which the effective resistance of the impedance ladder 1510 depends upon which of switches $S_1, S_2, \ldots S_N$ are in a conducting or non-conducting state. The individual switches $S_1, S_2, \ldots S_N$ of impedance ladder 1510 may be of any type, but are shown as comprising n-channel MOSFET transistors. Impedance ladder 1510 provides an impedance, Z, to amplifier 235, whose impedance is controlled by switches $S_1, S_2, \ldots S_N$. Amplifier 235 may be any kind of amplifier whose gain may be controlled by varying an impedance, Z, but is preferably an op-amp feedback amplifier in which the resistance ladder determines the gain. Preferably the number of logical outputs is selected so that the resistance of the impedance ladder 1510 may be incrementally adjusted as a function of rectified voltage 220 so that a variety of quasi-continuous compression functions may be approximated to a high degree of accuracy (e.g., step-changes in the resistance of the impedance ladder 1510 may be triggered by one dB changes in input signal strength to approximate linear, logarithmic, or other gain compression functions).

Logical selector 1600 provides logical outputs to control an impedance selector 250. A preferred logical selector 1600 comprising a plurality comparators in which each comparator has its reference voltage determined by a resistive voltage divider is shown in more detail in FIGS. 14–16. Logical selector 1600 preferably provides output control signals which are a logical function of the rectified voltage 220. In a preferred embodiment, each output, $X_1 \ldots X_N$ of logical selector 1600 corresponds to the single binary output for the logical function, is $V_R > V_i$,? where $V_R$ is the rectified voltage 220 and $V_i$ is a reference voltage for output $X_i$. The logical outputs of logical selector 1600 are input to an impedance selector 250, which selects an appropriate impedance to regulate the gain of amplifier 235 according to a compression function.

The preferred embodiment shown in FIG. 3 is what the inventor describes as a "mixed signal" circuit application. An analog signal from switched charging state rectifier 225 is converted into logical switch position decisions by logical selector 1600. The switch positions $S_1 \ldots S_N$ of resistor ladder 1510 are used to determine the resistance of resistor ladder 1510 so that it regulates the gain of analog amplifier 235 according to a compression function. This mixed signal application provides the benefit of improved control over the audio compression function because the logical selector 1600 and resistor ladder 1510 can be used to achieve a preselected compression function in which the gain varies with input signal magnitude according to any quasi-continuous function.

The sensitivity and resolution of switched charging state rectifier 225 is an important part of the present invention which permits the implementation of the embodiment of FIG. 3. However, since the sensitivity of conventional low-voltage rectifiers continues to improve, the function of switched charging state rectifier could be emulated by a sensitive low-voltage rectifier (i.e., one capable of resolving an audio input signal to less than one dB increments) coupled to other elements to achieve a rectified voltage with a selectable attack/release function (e.g., a passive arrangement of capacitors and resistors).

Figure 4:
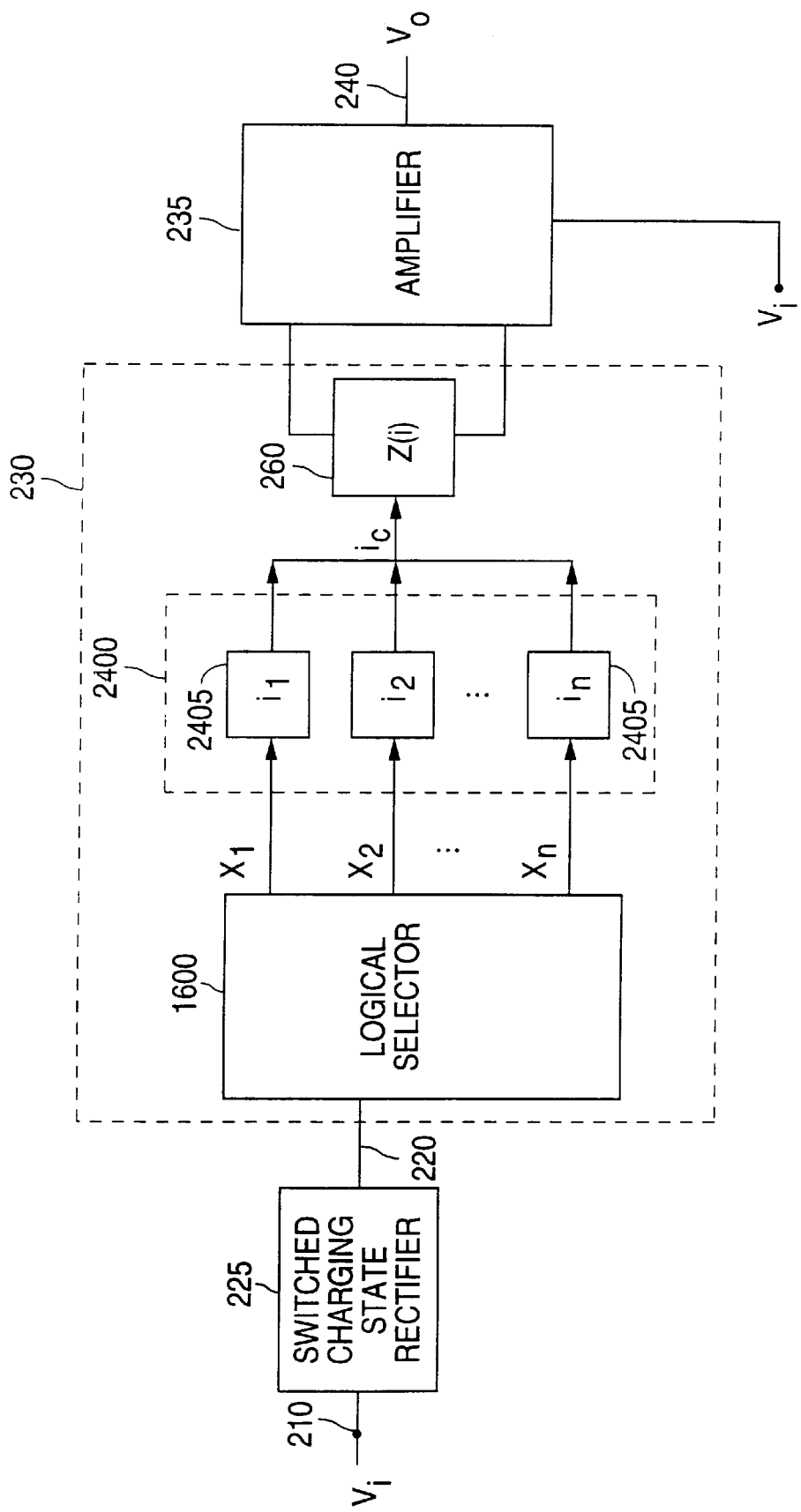
FIG. 4 is a schematic circuit diagram of an embodiment of the inventive audio compressor in which the currents from a selector are summed to provide a control current to adjust the output gain of an amplifier.

FIG. 4 shows a second embodiment of the audio compressor circuit of FIG. 2. As shown in FIG. 4, the rectified voltage 220 from switched charging state rectifier 225 is input to a selector 1600. Selector 1600 provides a plurality of comparator outputs $X_1, X_2, \ldots X_N$, each of which has a pre-selected trigger voltage. The outputs $X_1, X_2, \ldots X_N$ of selector 1600 are preferably used to select which constant current sources 2405 of current matrix element 2400 are turned on in order to adjust the magnitude of a control current, $i_c$. The control current, $i_c$, is used to control the impedance of a current-controlled impedance element 260 of an amplifier 235. Current-controlled impedance element 260 may be any conventional current-controlled impedance element, such as a current controlled resistor. Preferably, control current, $i_c$, may be varied in small enough steps so that the amplifier 235 gain may be regulated in a manner to implement a quasi-continuous compression function.

Figure 5:
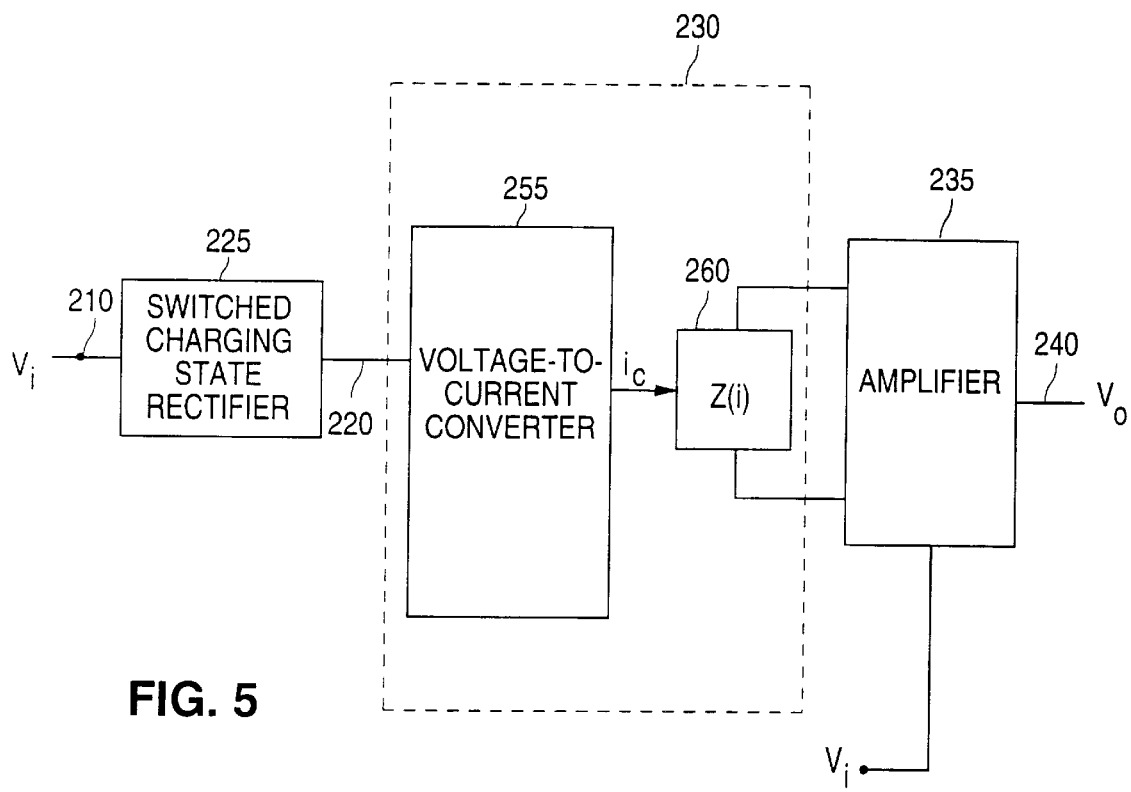
FIG. 5 is a block circuit diagram of an embodiment of the inventive audio compressor in which a current-controlled impedance is used to adjust the gain of an amplifier.

FIG. 5 shows a third preferred embodiment of an audio compressor. In the embodiment of FIG. 5, the rectified output 220 of switched charging state rectifier 225 is input to any conventional voltage to current converter 255. The output of voltage to current converter 255 is then input to a current controlled impedance element 260 of an amplifier 235.

Figure 6:
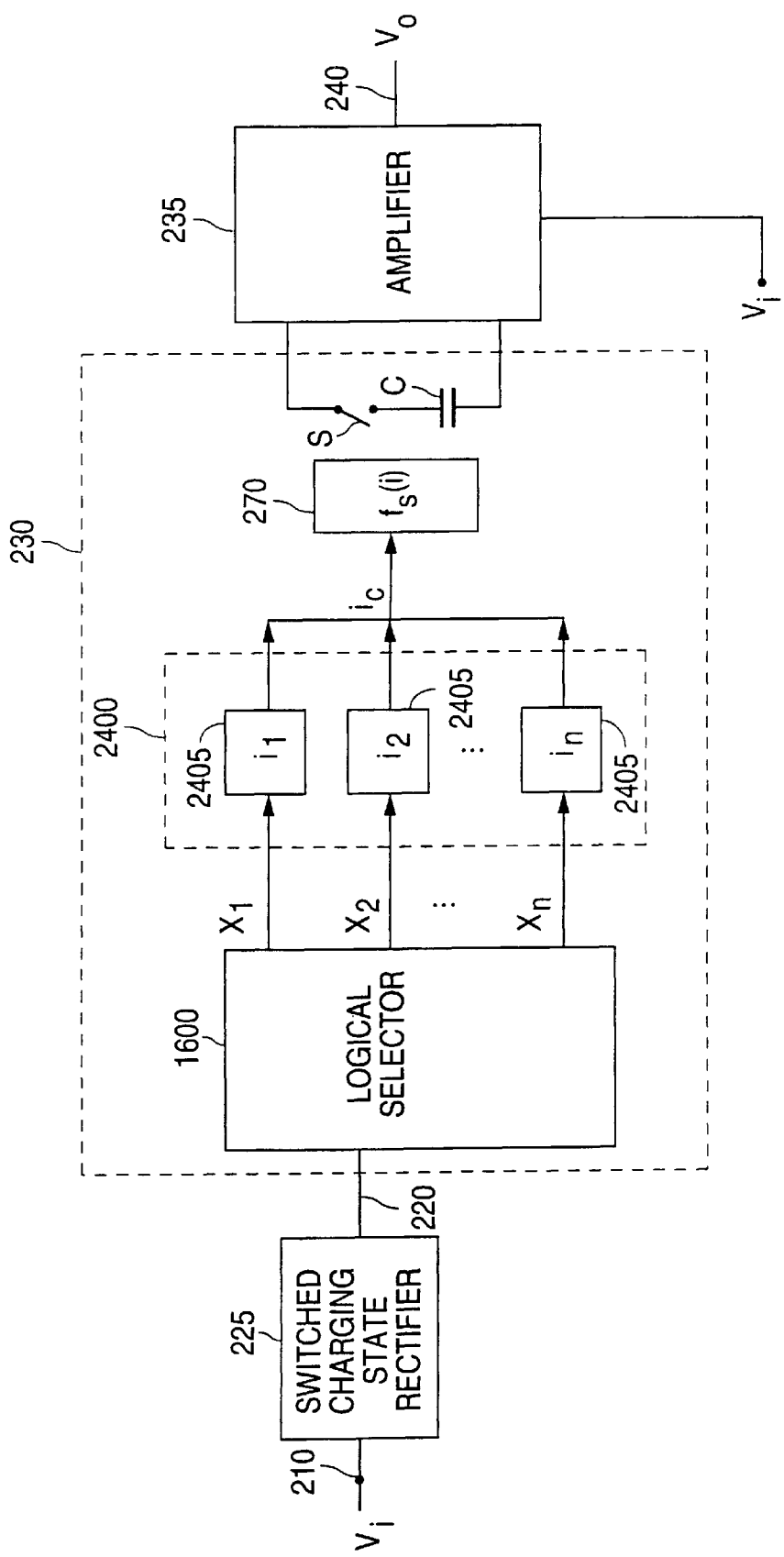
FIG. 6 is a schematic circuit diagram of an embodiment of the inventive audio compressor in which a switched capacitor element is used to control the gain of an amplifier.

FIG. 6 shows a fourth embodiment of an audio compressor, a preferred implementation of which is shown in more detail in FIGS. 22–26. The embodiment of FIG. 6 is similar to that of FIG. 4 in that it utilizes a logical selector 1600 to select which current sources 2405 of current matrix 2400 are enabled in order to adjust a control current $i_c$. However, in the embodiment of FIG. 6, the control current $i_c$ is fed into a current-controlled oscillator (clock) 270 whose frequency is a function of an input current. The output of oscillator 270 is used to control the operation of a switch S, which is in series with a capacitor, C, coupled to amplifier 235 as a switched capacitor element. The switched capacitor has an average resistance governed by the switching frequency so that the effective resistance of the switched capacitor is determined by the frequency of oscillator 270.

Figure 7:
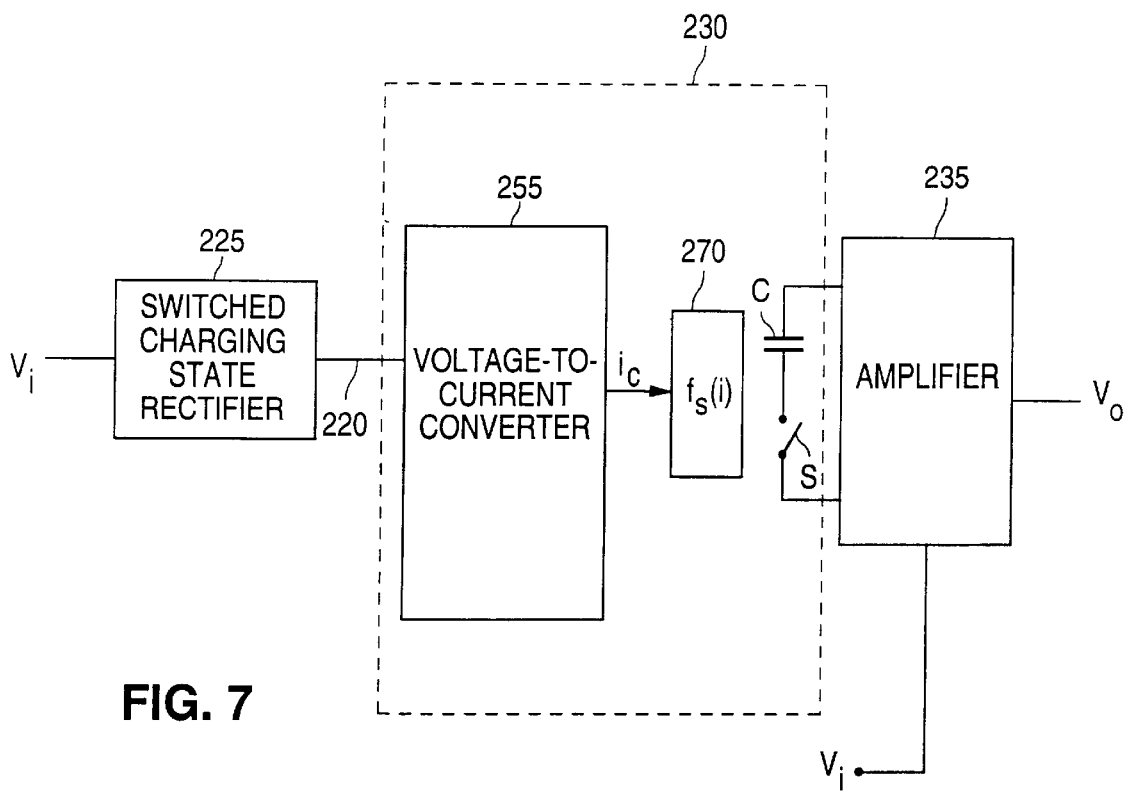
FIG. 7 is a schematic circuit diagram of a second embodiment of the inventive audio compressor in which a switched capacitor element is used to control the gain of an amplifier.

FIG. 7 is a fifth embodiment of an audio compressor, similar to that of FIG. 6, except that a conventional voltage-to-current converter 255 is used to convert the rectified voltage 220 of switched charging state rectifier 225 into a control current. As in the embodiment of FIG. 6, the control current is used to determine the switching frequency of a switched capacitor element via oscillator 270, thus permitting the gain of amplifier 235 to be controlled. Voltage-to-current converter 255 may comprise any conventional voltage-to-current converter but is preferably a bipolar transistor.

FIGS. 8–13: Switched Charging State Rectifier

FIGS. 8–13 show various embodiments of the switched charging state rectifier 220. Some of these embodiments are, for the purposes of teaching the present invention, half-wave rectifiers. However, it will be recognized by those of ordinary skill in the art that full-wave embodiments are preferred for audio applications. It will also be recognized by those of ordinary skill in the art that compact, low-voltage embodiments are preferred for miniature hearing aid applications.

Figure 8A:
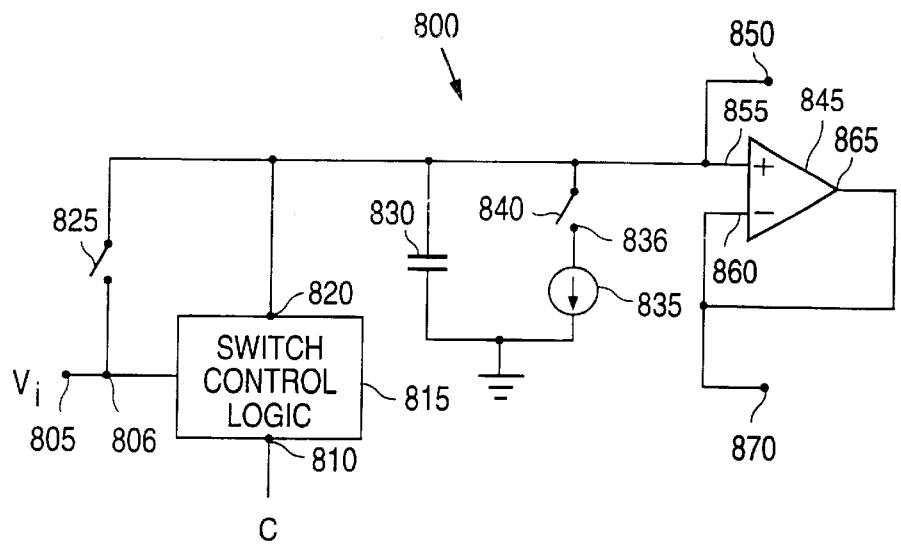
FIG. 8A is schematic circuit diagram of a first embodiment of switched charging state rectifier of the present invention.

FIG. 8A shows an illustrative circuit diagram of one embodiment of an inventive switched charging state rectifier 800. This embodiment, which is preferred in some low-cost hearing aid applications, provides an output that follows changes in the magnitude of the input signal 805 but which has a controlled release function. Op-amp 845 is preferably arranged in a so-called, "voltage follower configuration with op-amp output terminal 865 coupled on the inverting input terminal 860. In a voltage follower configuration, the voltage at op-amp input terminals 855, 860 is identical so that the voltage at node 850, op-amp output terminal 865, and node 870 (which is coupled to input terminal 860) are equal to one another. Since capacitor 830 is coupled to input terminal 855 of op-amp 855, the voltage on nodes 850 and 870 is identical to that of capacitor 830.

When charging switch 825 is closed and a discharge switch 840 is open, capacitor 830 is coupled to charging node 806 so that the voltage on capacitor 830 raised to the input voltage level 805 with a time constant limited only by the RC time constant of charging switch 825 and capacitor 830. When charging switch 825 is open and discharge switch 840 is closed, discharge current node 836 is coupled to capacitor 830 so that discharge current source discharges (e.g., sinks) the charge on capacitor 830, thereby reducing the voltage on capacitor 830.

The voltage on a capacitor is given by the expression: $V=Q/C$, where V is the capacitor voltage, Q is the charge, and C is the capacitance. The rate at which the voltage decreases is given by the expression: $dV/dT=1/C(dQ/dT)$. Since current source 835 determines the rate at which current discharges from capacitor 830, this can be expressed as: $dV/dT=I/C$, where I is the current of current source 835. The rate at which the voltage decreases can thus be selected by appropriate choice of C, I. Current source 835 may comprise any conventional current source. However, current mirrors, in particular, are a preferred current source because the current of a CMOS current can be precisely selected over a wide range of values. Moreover, by selecting a current mirror with a low-current, I, the capacitance can be correspondingly reduced, which permits capacitor 830 to be implemented as an integrated capacitor.

The opening and closing of shunt charging switch 825 and discharge switch 840 are controlled by a switch control logic element 815. Switch control logic element 815 has as a first input the input signal 805. Switch control logic element 815 has as a second input the voltage at capacitor 830 (which is equal to the voltage at input terminal 855 and the rectified output voltage 870). Additionally, switch control logic element 815 preferably has a third input signal corresponding to a clock signal 810 from a clock source (not shown in FIG. 8A). Clock signals 810 facilitate switch control logic element 815 periodically sampling the input voltage 805, comparing it to the rectified voltage 870, and making a decision on the proper switch position of discharge switch 840 and shunt switch 825.

There are two operating states of the switched charging state rectifier 800 of FIG. 8 when switch control logic element 815 is enabled by clock signals 810. In a first state, the input voltage 805 is increasing. In this first state, $S_1$, switch control logic element 815 acts to close charging switch 825 and to open discharge switch 840. This results in the output voltage 850 and the voltage on capacitor 830 increasing to the new level of input voltage 805. In a second state, $S_2$, the input voltage 805 is decreasing. In this second state, switch control logic element 815 acts to close discharge switch 840 and to open charging switch 825. This results in the voltage on capacitor 830 decreasing at a rate that depends upon the magnitude of the current of current source 835. Switch control logic element 815 preferably makes decisions to change the operating state of the switched charging state rectifier 800 in accord with clock signals 810 (e.g., the clock signals enable switch control logic element 815 to make decisions on changing the switch positions). The function of the switched charging state rectifier 800 of FIG. 8 is summarized in Table I.

TABLE I

Summary of the function of the inventive switched charging state rectifier of FIG. 8A.

| INPUT SIGNAL CONDITION WHEN CONTROL UNIT ENABLED | SWITCHES | OUTPUT VOLTAGE |
|---|---|---|
| Input Voltage 805 Greater Than Or Equal To Output Voltage 870 | Charging Switch Closed; Discharge Switch Open | Output Voltage 870 Increases To Increased Level of Input Voltage |
| Input Voltage 805 Less Than Output Voltage 870 | Charging Switch Open; Discharge Switch Closed | Output Voltage Decreases At A Rate Determined By Capacitance of Capacitor and Magnitude of The Discharging Current |

Figure 8B:
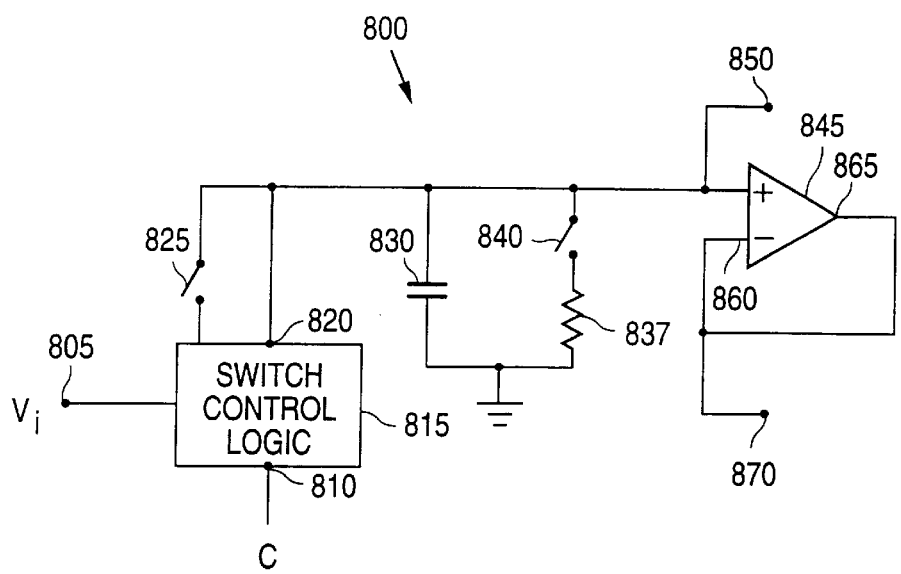
FIG. 8B is a schematic circuit diagram of a second embodiment of a switched charging state rectifier of the present invention.

While a constant current source 835 is a preferred implementation, the discharge current may also be determined by a non-constant current discharge path. FIG. 8B shows an embodiment in which current source 835 is replaced with a discharge resistor 837. In the context of compact hearing aids, this embodiment is less desirable because a discharge resistor 837 with a sufficiently large resistance to produce an RC time constant on the order of milliseconds with an integrated capacitor (i.e., a resistance on the order of at least several MegaOhms) would require a discrete resistor.

Figure 8C:
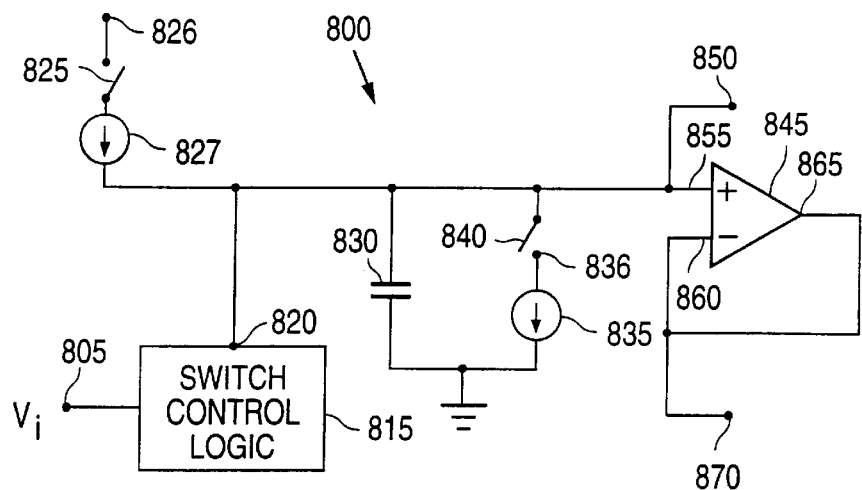
FIG. 8C is a modification of the switched charging state rectifier of FIG. 8A

The switched charging state rectifier 800 of FIG. 8A has an extremely short attack time, which is acceptable in many applications, such as in a low-cost compressor circuit. However, in some applications it is desirable to be able to further control the attack time. Variations of the switched charging state rectifier embodiment of FIG. 8A, are the subject of another patent application of the assignee of the present invention, "Multiple Time Constant Rectifier," application Ser. No. 09/475,802. The teachings of that application are hereby incorporated by reference and that application is being filed the same day as the present application. As shown in FIG. 8C, one of the variations described in more detail in "Multiple Time Constant Rectifier" is the modification of the switched charging state rectifier of FIG. 8A to include a constant current source 827 to control the attack time of switched charging state rectifier 800. In the embodiment of FIG. 8C, switch control logic closes charging switch 825 and opens discharge switch 840 when the magnitude of the input signal is greater than the voltage on capacitor 830. Consequently, current will flow from charging node 826 to capacitor 830. The charging current will increase the capacitor voltage at a rate determined by the magnitude of the current of current source 827 divided by the capacitance of capacitor 830. As discussed before in regards to FIG. 8A, when the magnitude of the input signal 805 is less than the voltage on capacitor 830, charging switch 825 is open and discharge switch 840 closes, resulting in the voltage on capacitor 830 decreasing at a rate determined by the magnitude of the current of current source 835 divided by the capacitance of capacitor 830.

Figure 9A:
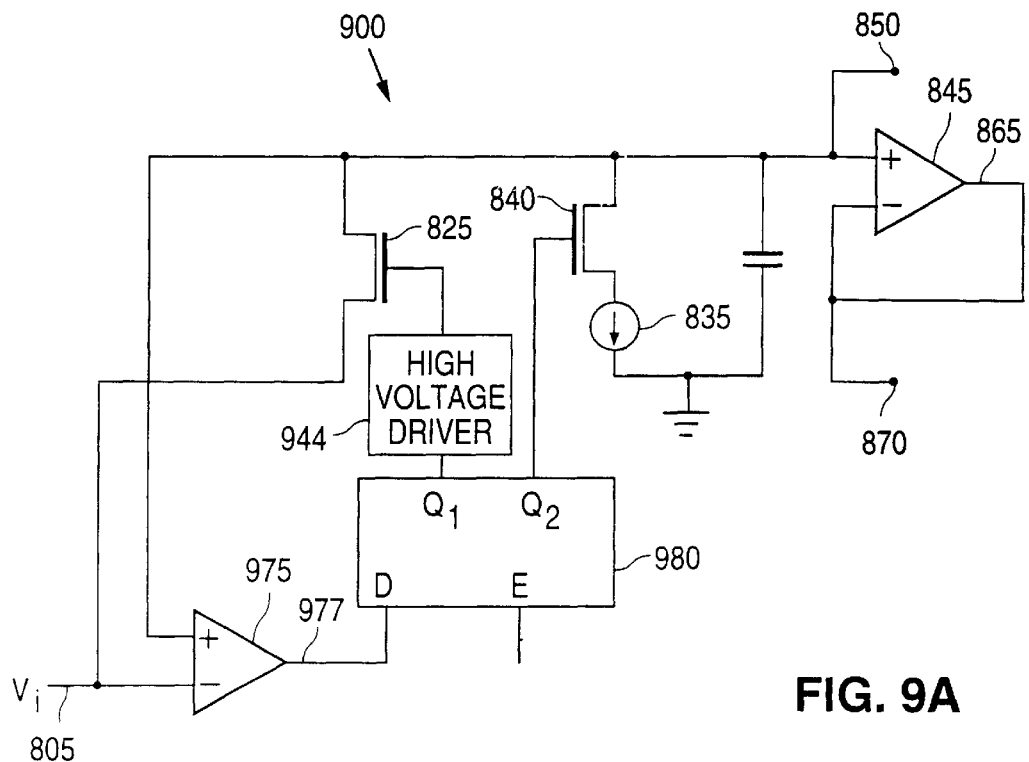
FIG. 9A is a schematic circuit diagram of a third embodiment of a switched charging state rectifier of the present invention.

The switch control logic element 815 of FIG. 8A may be implemented in a variety of ways. However, as shown in FIG. 9A, a preferred apparatus using a minimum number of circuit elements is to use a combination of comparators, data flip-flops, logic gates, and drivers. Switched charging state rectifier 900 uses a comparator 975 and a clocked data flip flop 980 to control the operation of the discharge MOSFET switch 840 and charging MOSFET switch 825. For low voltage operation, a high voltage driver 944 is preferably used to reduce the on-resistance of charging switch 825. A high voltage driver 944, such as a voltage doubler, also permits switch 825 to be dimensioned small enough to reduce parasitic charge injection effects. In accord with well-known principles of data flip-flop operation, changes in output state of data flip-flop 980 will only occur when data flip-flop 980 is enabled by clock signals to an input port E. Thus, clocked data flip-flop 980 will accept inputs from the comparator 975 and make logical decisions on a periodic basis, with the period governed by the frequency of clock signals entering the "E" port of clocked data flip-flop 980.

As indicated in FIG. 9A, charging switch 825 is coupled to one of the outputs of data flip-flop 880 by a high voltage driver 944. High voltage driver 944 may comprise any combination of static or dynamic voltage multipliers configured to provide a drive voltage sufficient to drive charging switch 825 well into the ohmic region, to reduce the on-resistance of the switch, and permitting its gate width to be comparatively narrow (e.g., less than about five microns) to reduce the effects of parasitic charge injection and capacitive feedthrough in the operation of the circuit. Discharge switch 840 is coupled to the other (complementary) output of data flip-flop 980. As can be seen in FIG. 9A, whenever the rectified voltage 870 is higher than the input voltage 805, a high signal will enter the "D" port of flip-flop 975 from the output 977 of comparator 975. Consequently, the first output, $Q_1$, of data flip flop 980 coupled to the gate of switch 825 will be high, turning charging switch 825 on. The second (complementary) output, $Q_2$, of data flip flop 880 is coupled to the gate of discharge switch 840. Since $Q_2$ is the complement of the first output $Q_1$, $Q_2$ is low and discharge switch 840 will be open. When the input voltage 805 on comparator 975 begins to decrease, the outputs of the data flip flop 980 will change so that $Q_1$ is low and $Q_2$ is high, shutting off shunt switch 925 and closing discharge switch 940.

Figure 9B:
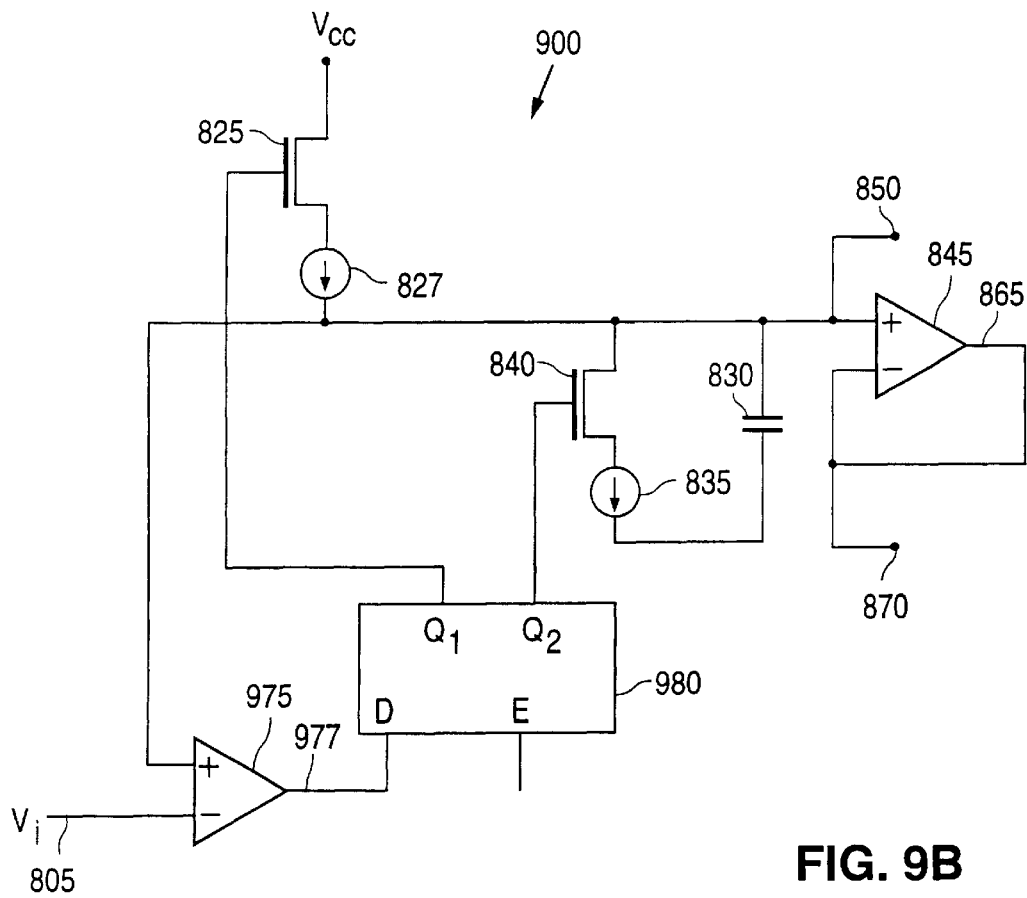
FIG. 9B is a schematic circuit diagram of a fourth embodiment of a switched charging state rectifier of the present invention.

FIG. 9B shows an embodiment of logical control element 815 for the embodiment of FIG. 8C. MOSFET charging switch 825, however, couples capacitor 830 to a current source 827. While FIGS. 9A and 9B show embodiments with constant current sources 835, 827, more generally non-constant current sources could be used as well. Moreover, while it is desirable for many hearing aid application that the current source (constant or non-constant) be selected to achieve an attack/release time on the order of at least one millisecond, a circuit designer may select the attack/release times as desired. In some applications, for example, it may be desirable to have a comparatively high discharge current so that switched charging state rectifier emulates the response of an ideal rectifier (i.e., negligible attack/release time constants).

Figure 9C:
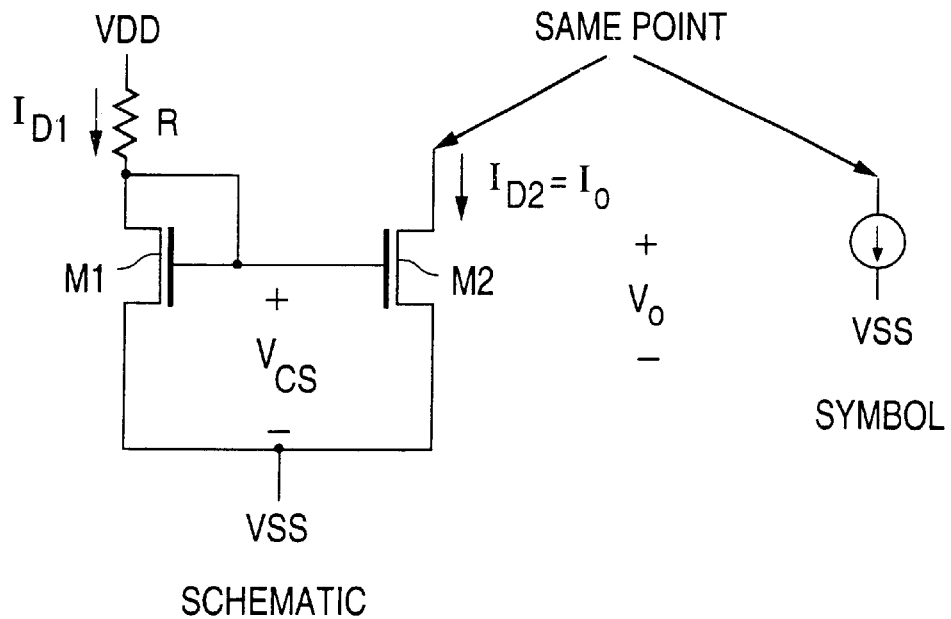
FIG. 9C is a schematic circuit diagram of a prior art current mirror.
Figure 9D:
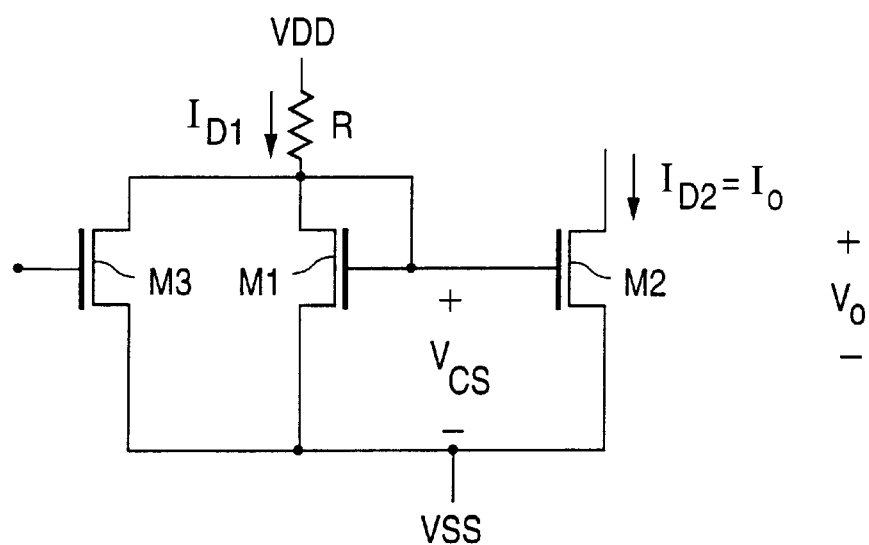
FIG. 9D is a schematic circuit diagram of an inventive current mirror circuit with an additional transistor switch coupled to the current mirror to turn on and off the mirror current.

Referring again to FIGS. 8A and 8C, switched current sources are utilized in preferred embodiments of the switched charging state rectifier to control the release function and/or attack function. The inventor has developed a switched current mirror which may be used to perform this function. A conventional current mirror is shown in FIG. 9C. In a MOSFET current mirror, the gates of two MOSFETS are coupled together. The first MOSFET M1 is a diode-connected-transistor, i.e., its drain and gate are electrically connected. A reference bias current, $I_{D1}$, flowing through the source-drain terminals of diode-connected-transistor M1 determines the mirror current in the second MOSFET M2 because the bias voltage on the gate of transistor M2 is determined by the voltage coupled by diode-connected-transistor M1. The reference bias current $I_{D1}$, is supplied by another current source. The mirror current, $I_{D2}$ is a multiplicative factor of the reference bias current, $I_{D1}$, with the multiplicative factor depending upon the relative sizes (e.g., gate width) of transistors M1 and M2. Any conventional current mirror whose current output may be regulated using another switch may be used as part of a charging current element or discharging current element of the present invention. FIG. 9D shows a preferred embodiment of a switched current-mirror. A switch M3 has its source and drain terminals coupled to those of transistor M1. When switch M3 is turned on, it will shunt reference bias current $I_{D1}$ from transistor M1, which turns off the mirror current of transistor M2 (which is a multiplicative factor of the current flowing in transistor M1). Thus, a current mirror may be used to perform the function of a current source 827, 835 with switch M3 performing the function of a switch 825,840 to turn on/off the mirror current. The selection of reference bias current $I_{D1}$ and the relative sizes of transistors M1 and M2 may be used to create a current source with a very small and accurately controlled current value. This permits the charging and discharging currents to be selected to achieve a wide range of charging/discharging rates of capacitor 230.

Figure 10:
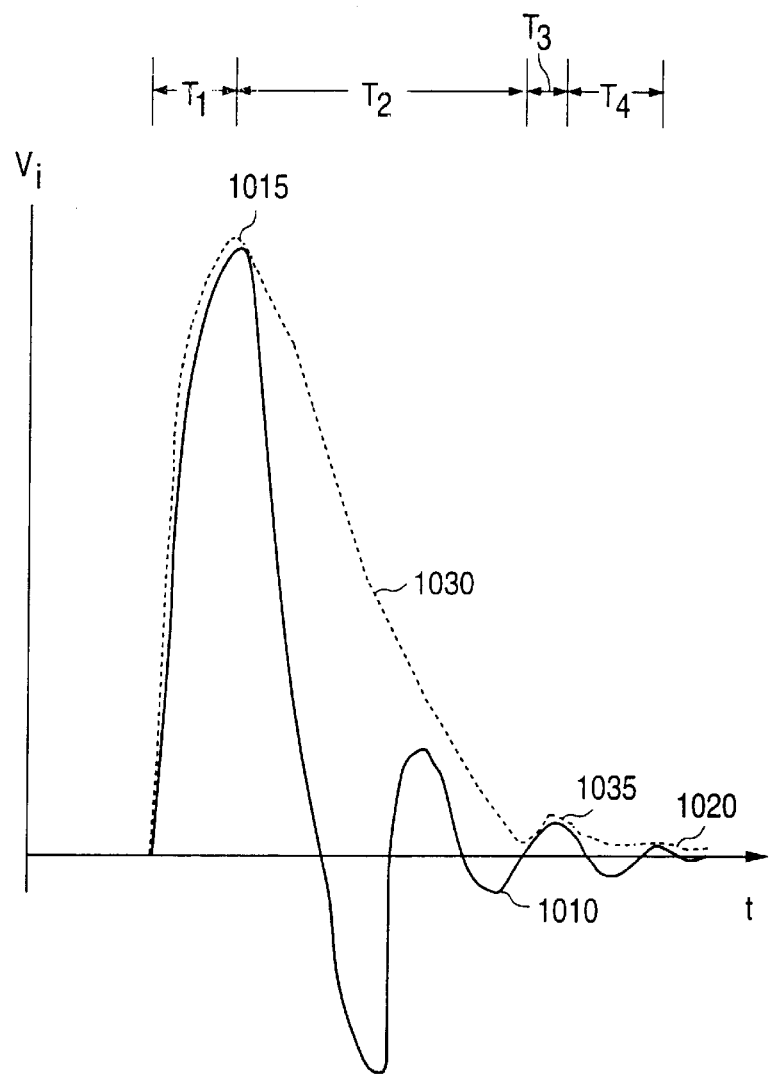
FIG. 10 is an illustrative plot of the output voltage of the inventive switched charging state rectifier of FIG. 8A as measured in response to an audio input signal.

FIG. 10 is an illustrative plot of output voltage versus input voltage for the inventive switched charging state rectifier 900 of FIG. 9A. In a first time interval, $T_1$, the input voltage 1010 is rapidly increasing so that the switched charging state rectifier 900 functions in the first state, $S_1$, with the charging switch 825 closed and discharge switch 840 open. Consequently, the output voltage 1030 tracks the input voltage 1010 to peak 1015. In a second time interval $T_2$, input signal 1010 is decreasing, and the circuit switches to the second operating state, $S_2$, with shunt switch 825 open and discharge switch 840 closed. The output voltage 830 decreases according to an discharge time constant governed by the rate at which discharge switch 840 permits current to leave capacitor 830. At the beginning of a third time interval $T_3$, the input voltage 1010 begins to exceed the output voltage so that the circuit switches back to the first operational state, causing the output signal 1030 to again track the input voltage 1010 to peak 1035. At the beginning of a fourth time interval $T_4$, input signal 1010 begins to decrease, so that the circuit switches back into the second operational state.

Figure 11:
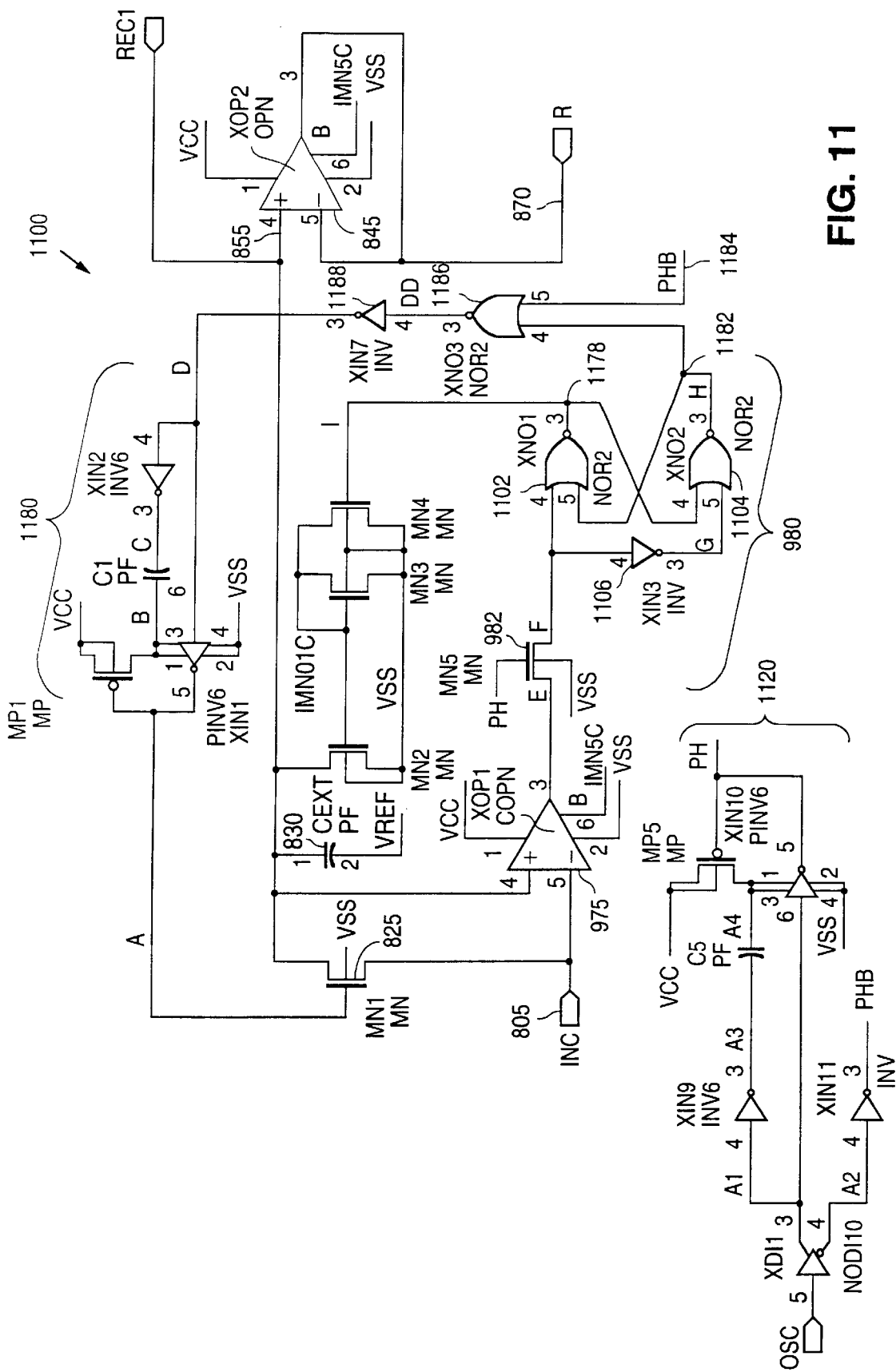
FIG. 11 is a fourth embodiment of the inventive switched charging state rectifier designed to function at a nominal supply voltage of 1.2 VDC.

A preferred embodiment of a low-voltage switched charging state rectifier 225 utilizing a current mirror as a constant current source 835 and a high voltage driver 944 is shown in FIG. 11. Charging switch 825 is preferably an n-channel MOSFET transistor, since n-channel MOSFETs have a higher conductance per unit of gate width compared with p-channel MOSFETs. A transient voltage pulse doubler 1180 is used as part of a high voltage drive 944 (shown in FIG. 9A) to increase the voltage of control signals 1182 supplied to the gate of charging switch 825 to greater than about 1.8 volts. A variety of voltage doublers are known in the prior art. However, the transient voltage pulse doubler 1180 shown in FIG. 11 is preferred because of its compactness and efficiency. A transient voltage pulse doubler for increasing the voltage to the switches of a Class-D power amplifier is described in U.S. patent application Ser. No. 09/149,257 now U.S. Pat. No. 6,157,252 of the assignee of the present invention, the teachings of which are hereby incorporated by reference. A compact transient voltage pulse doubler for increasing the voltage of a small number of switches is described in the patent application of the assignee of the present invention, "Switched Capacitor Filter With Integrated Voltage Multiplier," Ser. No. 09/474,850, which is being filed the same day as the present application. The teachings of "Switched Capacitor Filter With Integrated Voltage Multiplier," are also hereby incorporated by reference. As indicated in FIG. 11, a voltage multiplier 1120 is also preferably used to generate voltage multiplied control signals for the operation of switch 982.

As shown in FIG. 11, a current mirror is preferably used to control the discharge current. Transistors MN2 and MN3 comprise a portion of a current mirror which is turned on/off by transistor MN4. A reference current source is omitted for the purposes of clarity in FIG. 11. However, any low-current reference current source may be coupled to line IMNO1C to complete the current mirror in the manner shown in FIG. 9D. When the voltage on the gate of MOSFET MN4 is high, transistor MN4 is switched on, which results in a low (e.g., zero) gate voltage on MOSFET MN2 corresponding to an open circuit. However, if the voltage on the gate of MOSFET MN4 is low, MOSFET MN4 is substantially non-conducting and the gate voltage on the gate of transistor MN2 will rise to a level determined by the reference current flowing in transistor MN3 so that, MOSFET MN2 will conduct a mirror current.

Comparator 975 sense changes between the rectified voltage 855 and the input voltage 805. A high performance comparator can sense extremely small voltage differentials on the order of micro-volts. Transistors 982 is coupled to NOR gates 1102,1104 and inverter 1106 to form a clocked data flip flop. The first output 1178 of data flip flop 980 drives the gate of transistor MN4 of low voltage driver 942. The second complementary output 1182 of data flip flop 980 is used to control the operation of shunt switch 825 As can be seen in FIG. 11, second complementary output 1182 of data flip flop 980 is input to a NOR logic gate 1186 along with an inverted clock signal PHB. An inverter 1188 is used to invert the output of NOR gate 796 prior to transient pulse voltage multiplier 1180, with the output of transient pulse voltage multiplier 1180 driving the gate of shunt charging transistor 825.

The circuit of FIG. 11 has two operational states. The first operational state corresponds to the input voltage being greater than or equal to the rectified voltage. When the input voltage 805 exceeds the rectified voltage 870, the output of comparator 975 is low. First output 1178 of data flip flop 980 will be high, so that transistor MN4 will turn off the current mirror comprises of transistor MN2 and MN3 The second output 1182 of data flip flop 980 will be low, which results in a high output 1182 from transient pulse voltage multiplier 1180, which turns on shunt switch 825. Charging switch 825 is turned on, and the rectified voltage 870 follows the input voltage in accord with the principles of a voltage follower op-amp circuit. The second operational state is for the case the input voltage is less than the rectified voltage. When the input voltage 805 is less than the rectified voltage 870, comparator 890 produces a high output to data flip-flop 790. Second output 1182 of data flip-flop 790 will be high whereas first output 1178 of data flip-flop 980 will be low. A low value of first output 1178 resulting in transistor MN4 turning on the current mirror comprising transistors MN2 and MN3, discharging the capacitor. The corresponding high value of second output 1182 results in a low output voltage of transient voltage multiplier 1180 so that charging transistor 825 is an open switch. The rectified voltage 870 will, in accord with the principles of a voltage follower, decrease as current is discharged from capacitor 830 by the mirror current of transistor MN2. This state will continue until the voltage on capacitor 830 decays to the level of the input voltage 805.

Figure 12:
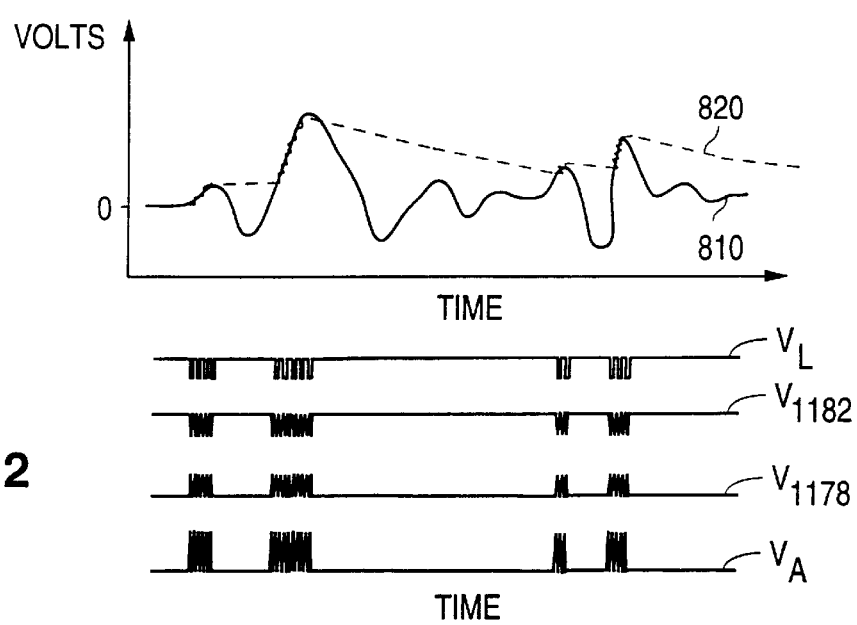
FIG. 12 is an illustrative plot of the output voltage of the switched charging state rectifier of FIG. 11 as measured in response to an audio input signal.

FIG. 12 shows an illustrative plot of an input voltage 810 and its corresponding output voltage 820 for switched charging state rectifier 1100 as a function of time. Additionally, corresponding voltages at the output E of comparator 790, the output voltages 1178, 1182 of data flip-flop 798, and the output A of transient pulse voltage multiplier 780 are shown.

Figures 13, 13A:
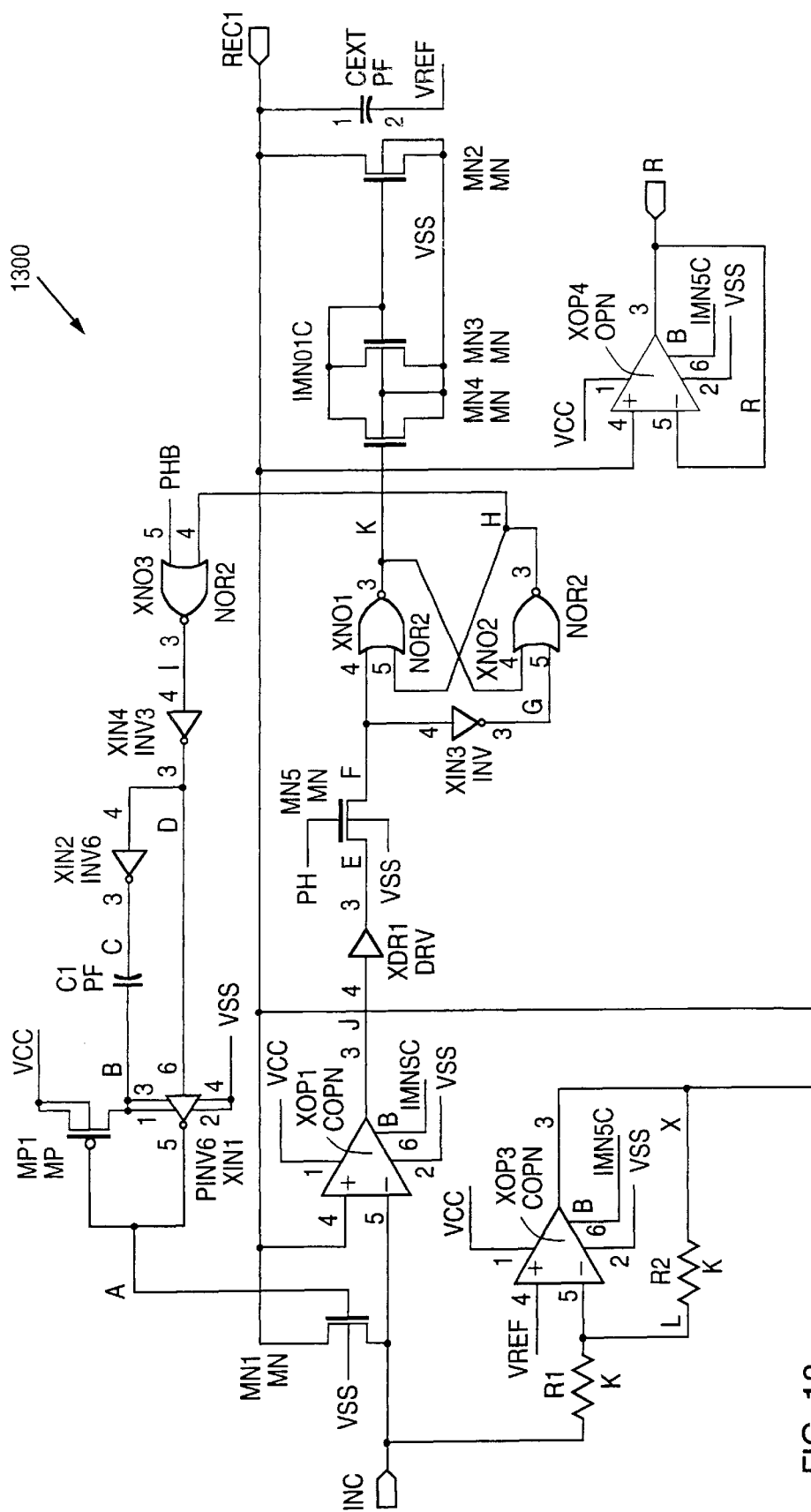
FIG. 13 is a fifth embodiment of a switched charging state rectifier configured to function as a full-wave rectifier.
Figure 13B:
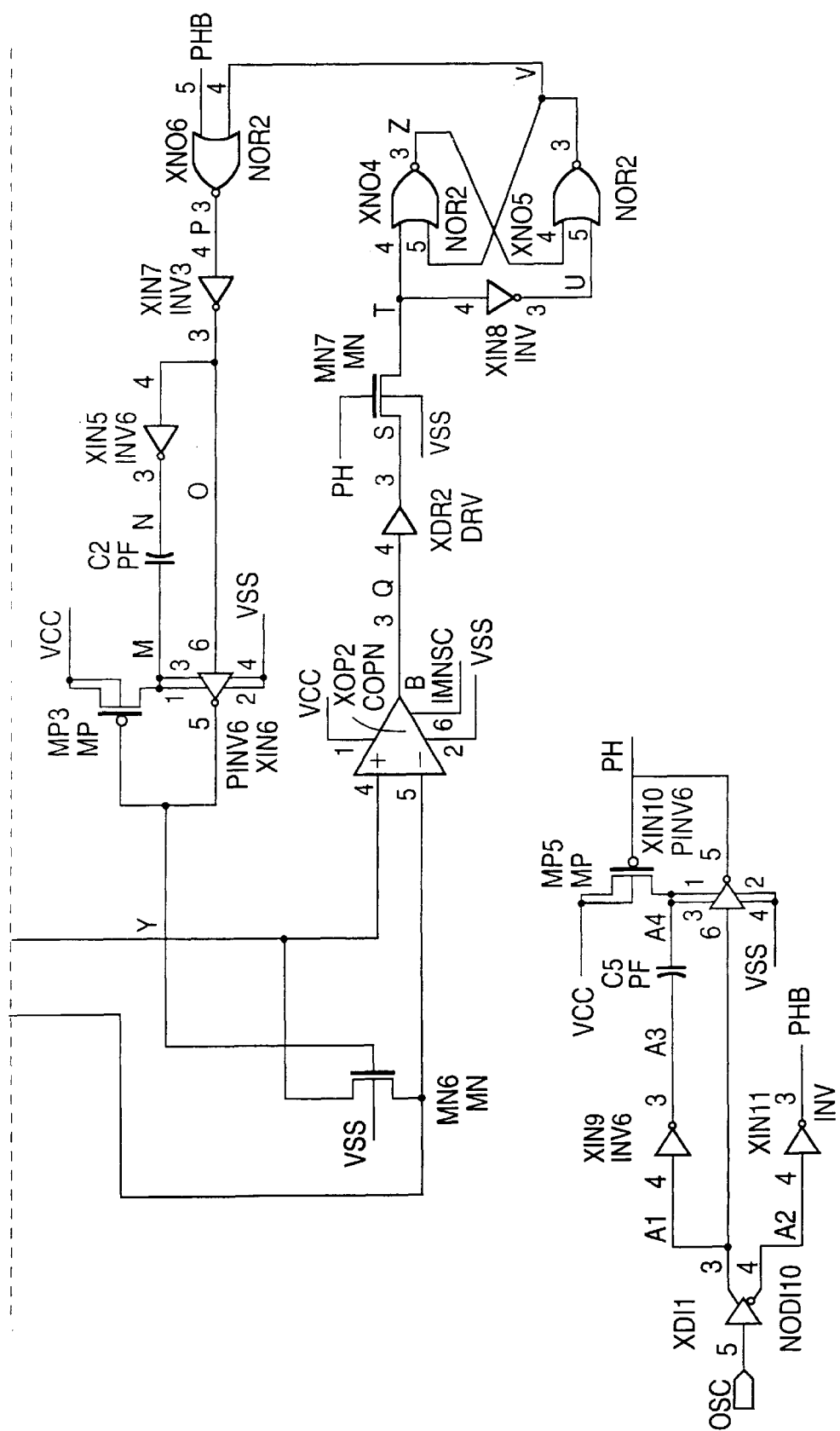

FIG. 13 shows a preferred embodiment of a full-wave switched charging state rectifier 1300 suitable for use as part of the present invention. The function of the key circuit sub-blocks has been already described in regards to the embodiment of FIG. 11. In order to achieve full-wave rectification, an additional op-amp configured as a voltage inverter is used so that the rectified voltage may be compared to the inverted input voltage whenever the voltage has a negative sign.

In order to compare the inverted voltage with the capacitor, the other comparison and decision circuits previously described are required. Thus, the embodiment of FIG. 13 requires the additional elements of a voltage inverter; second shunt charging switch to coupled the inverted voltage input to the capacitor; a second comparator coupled to the rectified voltage and the inverted voltage input; a second data flip-flop configured to provide control signals to run on the second shunt switch; and a second high voltage driver to increase the strength of drive signals to the second shunt charging switch.

Calculations by the inventor indicate that switched charging state rectifier 1100 can sense input voltage changes at least as small as 250 $\mu$V and perhaps as low as 10 $\mu$V. The ultimate limit on the sensitivity of the switched charging state rectifier is limited by the sensitivity of the comparators. The ability of switched charging state rectifier 225 to resolve small differences in the magnitude of an input signal 205 permits switched charging state rectifier 225 to distinguish small variations in the power of the input signal to a hearing aid, such as a change from an input signal level of 50 dB to 51 dB. No conventional low-voltage rectifier has a comparable sensitivity and resolution.

Figure 14:
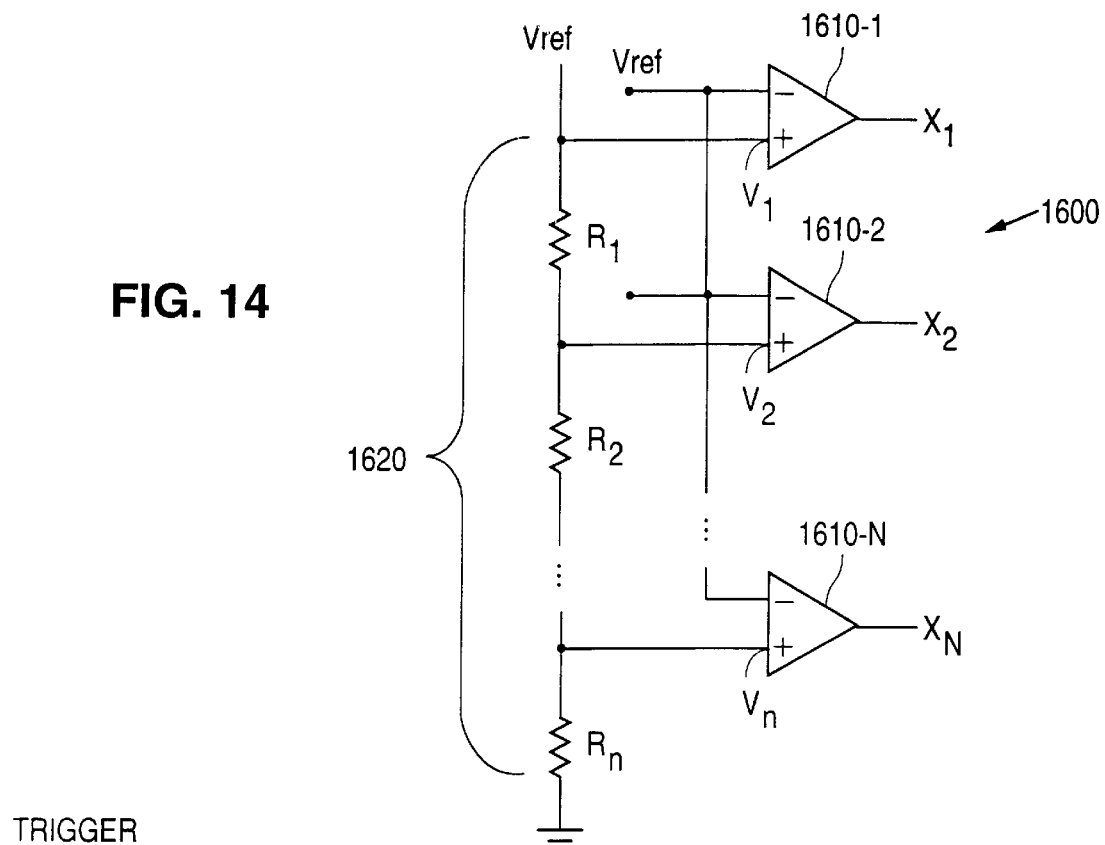
FIG. 14 is a schematic circuit diagram of a selector circuit comprising a plurality of comparators whose trigger voltages are controlled with a voltage divider circuit.
Figure 15:
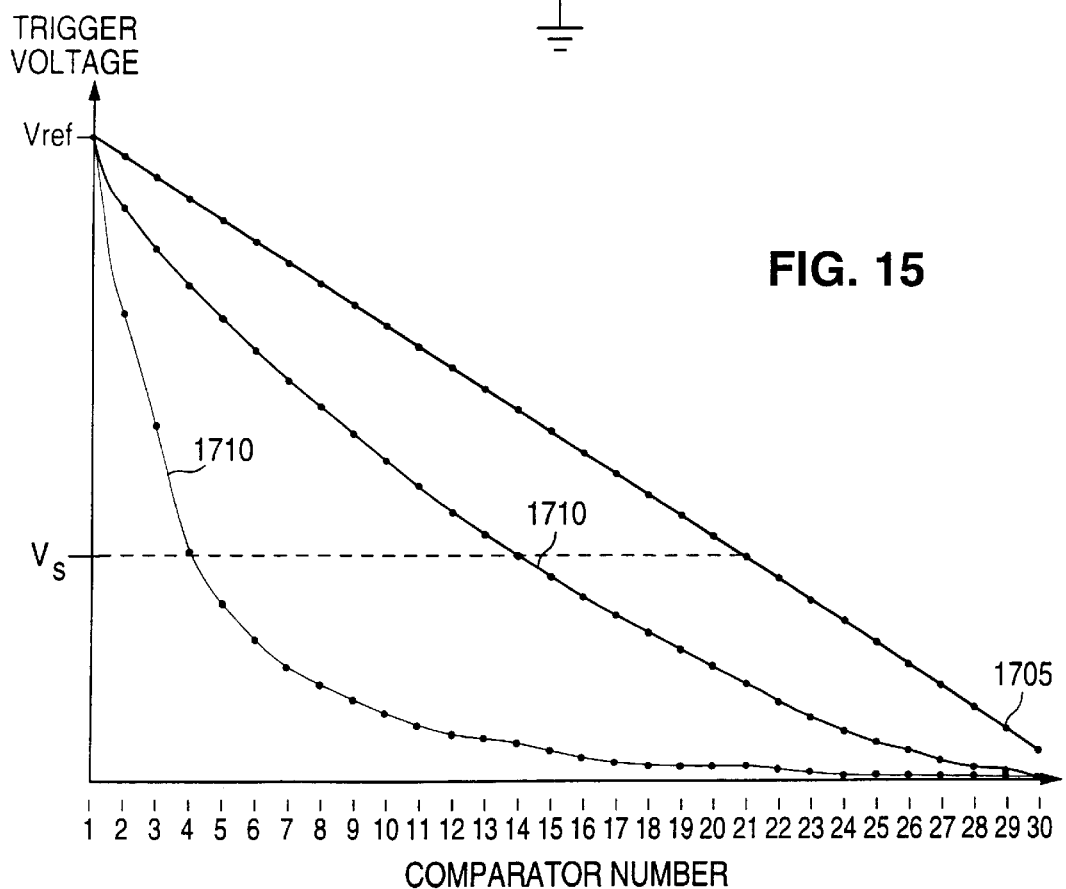
FIG. 15 shows three illustrative plots demonstrating how the trigger voltages of the comparators of FIG. 14 may be selected to approximate various mathematical functions by selecting the resistance values of the resistors which are part of a voltage divider.

FIGS. 14–16: Preferred Selector Circuit

Referring back to FIG. 2C, a selector 1600 is preferably used to convert a rectifier voltage 220 from switched charging state rectifier 225 into control signals for an impedance selection circuit 250 whose impedance is controlled by a plurality of switches. The function of logical selector 1600 could be performed using an A-D converter and other memory and control elements. However, the inventors have developed an extremely compact selector 1600 that reduces the circuit area which would otherwise be required to implement the same function.

Selector 1600 preferably comprises a total of N comparators 1610, where N is an integer greater than one. One input to each comparator 1610 comprises the rectified voltage 220 from the switched charging state rectifier 225. The other input to each comparator 1610 is the voltage from a voltage divider network 1620 comprising at least N resistors connected in series to a reference voltage, $V_{ref}$. As indicated in FIG. 14, each comparator 1610-$i$, has an associated resistor, $R_i$. The resistance of each resistor $R_1, R_2, \ldots R_N$ is selected so that the voltage at each resistor, $V_1, V_2, \ldots V_N$ is used as a reference voltage for comparators 1610-1, 1610-2, . . . 1610-N.

Reference voltages, $V_1, V_2, \ldots V_N$ may be related to one another according to a variety of mathematical relationships which may be implemented by appropriate selection of the values of resistors $R_1, R_2, \ldots R_N$. Modern integrated circuit fabrication techniques permit the values of the resistance of each resistor to be selected over a wide range (e.g., over a range between 1 kilo-Ohm to over one-hundred kilo-Ohms). The output voltage along a voltage divider 1310 can be readily calculated from well-known voltage divider expressions. By appropriate selection of the values of each resistor, $R_1, R_2, \ldots R_N$, the values of $V_1, V_2, \ldots V_N$ may be selected to be a pre-calculated fraction of $V_{ref}$ based upon the ratio of the sum of the resistances connecting a given comparator input to ground divided by the total resistance in the chain, which can be expressed mathematically for the ith resistor as: Vi=$V_{ref}$ΣRi/ΣR. Since the trigger voltage depends upon a ratio of resistances, it is independent of lot-to-lot fabrication tolerances of the resistors.

FIG. 15 shows illustrative plots, not to scale, of the trigger voltages of the comparators of a selector 1600 comprising a total of thirty comparators. As indicated in FIG. 15, the ratiometric values of the resistors may be selected so that the trigger voltage of successive comparators 1610 approximates a variety of functions, such as a linear function 1705, a square function 1710, or a logarithmic function 1720. For a given rectified voltage, $V_{rect}$, only those comparators 1610 of selector 1600 whose trigger voltage is equal to or less than $V_{rect}$ will be turned on. For example, in the example of FIG. 15, a rectified voltage with a magnitude of $V_s$ would trigger comparators 1610-5-to-1610-30 for the function of plot 1720, comparators 1610-14-to-1610-30 for the function of plot 1710, and comparators 1610-21-to-1610-30 for the function of plot 1705.

As can be seen in FIG. 15, the trigger voltages of the comparators 1610 may be set to adjust switch positions in other circuit elements according to a variety of pre-selected mathematical functions. Moreover, the use of a voltage divider to determine the trigger voltages permits small voltage steps (e.g., 250 micro-volt steps) to be converted into comparator outputs used to control an impedance selection circuit.

Figure 16A:
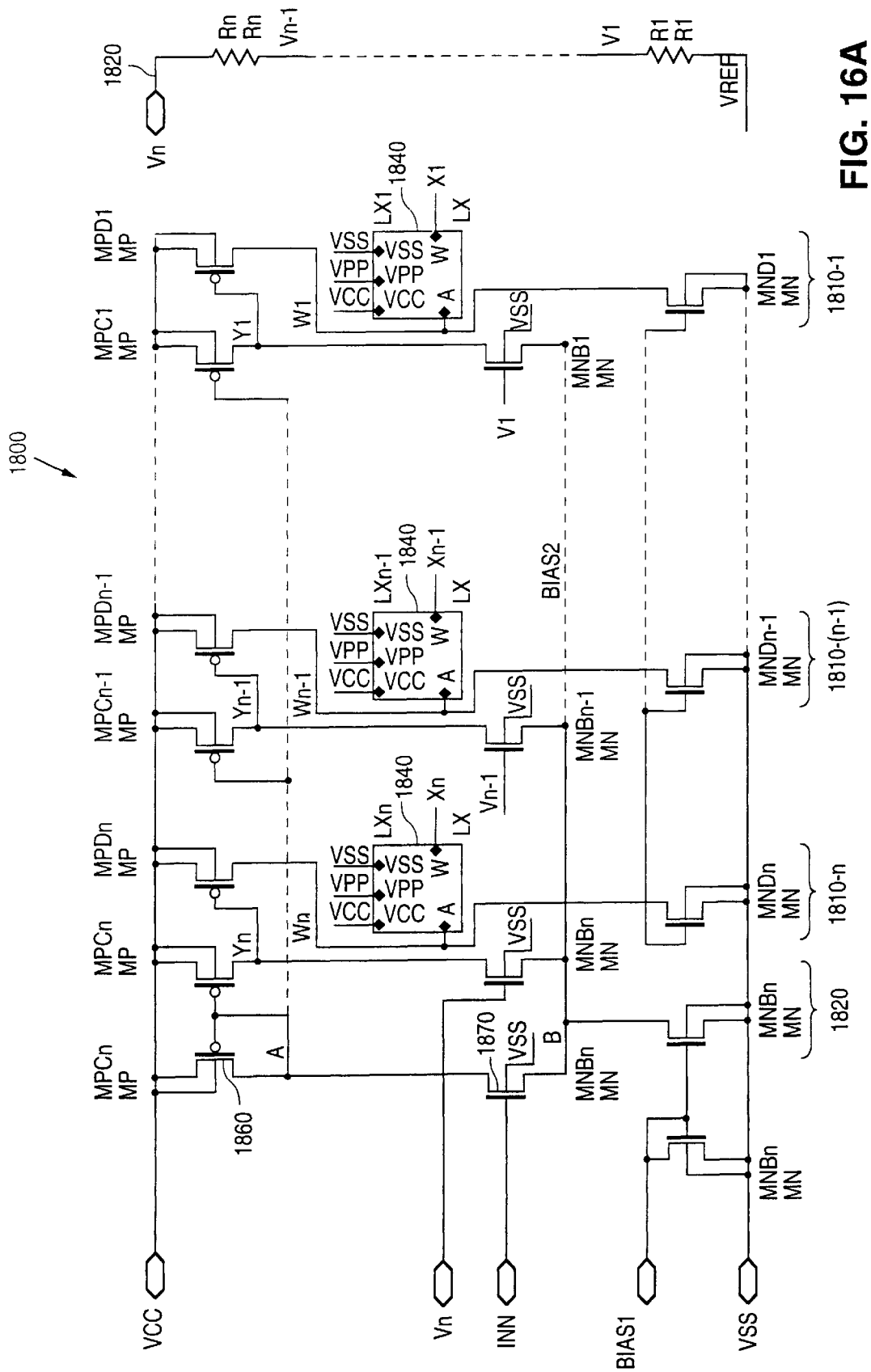
FIG. 16A is a circuit schematic of a preferred embodiment of the selector circuit of FIG. 14.
Figure 16B:
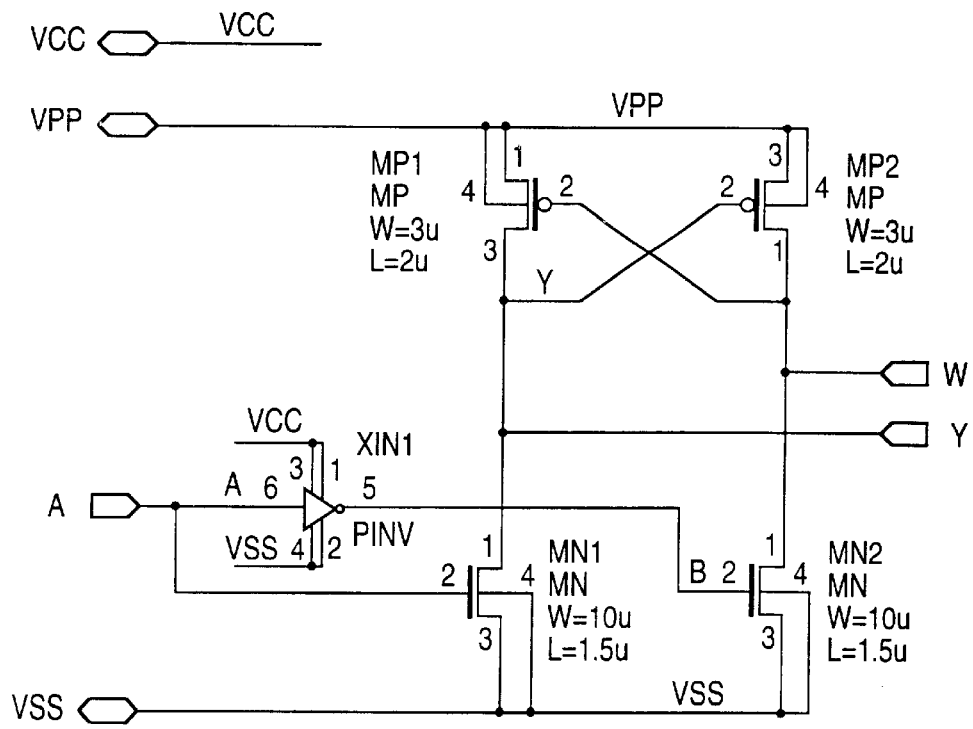
FIG. 16B is a circuit schematic of a preferred level shifter used in the selector of FIG. 16A.

FIG. 16A shows a preferred circuit embodiment to implement the selector of FIG. 14. The comparator circuit utilizes many elements similar to conventional analog to digital (A-to-D) converters. However, conventional A-to-D converters split a reference voltage into uniform increments (i.e., utilize a resistor divider with a string of identical resistors), which would require additional logical and memory elements to convert the digital code into switch control signals to implement a compression function. Resistor voltage divider 1820 preferably has its resistance values selected to produce trigger voltages to implement a compression function, which ordinarily implies that each of the resistors has a different resistance value in order that the trigger voltages obey a non-linear mathematical function. Additionally, there are many more comparator elements 1810 (e.g., thirty-to-fifty) in selector 1800 than in a standard eight-bit digital to analog converter. To economize on circuit area, a common front-end differential pair 1820 comprising transistor 1860, 1870 is used. Selector 1800 preferably incorporates hysteresis to avoid the output oscillating when a signal is at an amplitude which wavers slightly around a trigger voltage. Level shifters 1840 are incorporated to increase the voltage at key circuit nodes in order to implement the selector in a low-voltage circuit. A circuit schematic of a preferred level shifter is shown in FIG. 16B.

FIGS. 17–21: Preferred Embodiment of Switched Resistance Ladder Compressor

Referring again to FIG. 3, a preferred embodiment of the present invention utilizes the output 220 of switched charging state rectifier 225 to adjust the resistance of a resistance ladder 1510 using a logical selector 1600. In the context of low-voltage hearing aids preferably the full-wave embodiment 1300 of a switched charging state rectifier shown in FIG. 13 is used.

Figure 17:
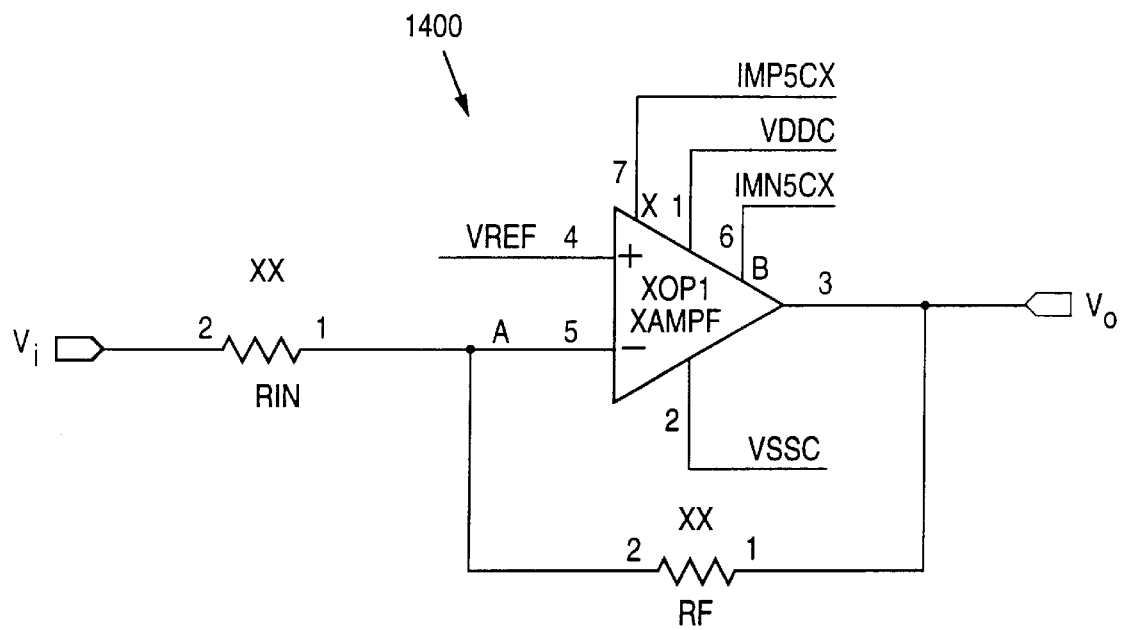
FIG. 17 is a schematic circuit diagram of a prior art op-amp feedback amplifier.

FIG. 17 shows a conventional op-amp amplifier 1405 configured as an inverting amplifier 1400. The voltage gain, $V_o/V_i$, of the inverting amplifier 1400 is proportional to the ratio of the resistance of the feedback resistor, $R_f$ to the input resistor, $R_I$, or $R_f/R_I$. The voltage gain of the inverting amplifier 1400 may be adjusted if the value of either $R_f$ or $R_I$ is controllable.

Figure 18:
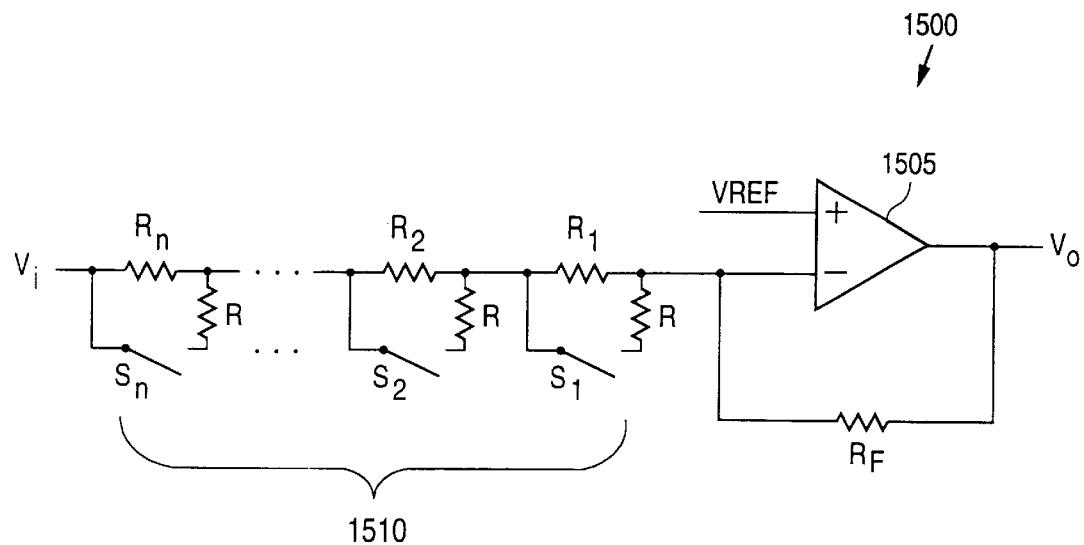
FIG. 18 is a schematic circuit diagram of an op-amp feedback amplifier in which one of the resistors is replaced by a resistor ladder whose resistance may be selected by a plurality of switches.

FIG. 18 shows an inventive circuit arrangement 1500 in which one of the resistors of an op-amp feedback amplifier is replaced with a resistor ladder 1510. One of the resistors of the amplifier of FIG. 17, preferably $R_{IN}$, is replaced with a resistor ladder comprised of a series of resistors $R_1$, $R_2$, ... $R_N$ and switches $S_1$, $S_2$, ... $S_n$. The positions of switches $S_1, S_2 \ldots S_N$ determines which resistors $R_1, R_2, \ldots R_N$ conduct current. There may also be an additional resistance, R, associated with each "rung" of the resistor ladder. The effective gain of the inverting amplifier 1505 may be varied by changing the position of switches $S_1$, $S_2 \ldots S_N$, which alters the ratio of the resistor $R_F$ to that of the resistor ladder 1510. A resistor ladder 1510 comprised of a comparatively large number of resistors and switches (i.e., N is a large integer) permits the gain of inverting amplifier 1505 to be adjusted over a large number of steps. The human ear cannot readily discern differences in sound level less than about one dB. Consequently, it is desirable to have at least one switched resistor in the resistor ladder for each dB of sound level over which the resistor is used to produce a step-wise approximation of a continuous compression function. For a variety of applications, a total of between about thirty to fifty switched resistors is sufficient to approximate a smoothly varying compression function.

Figure 19:
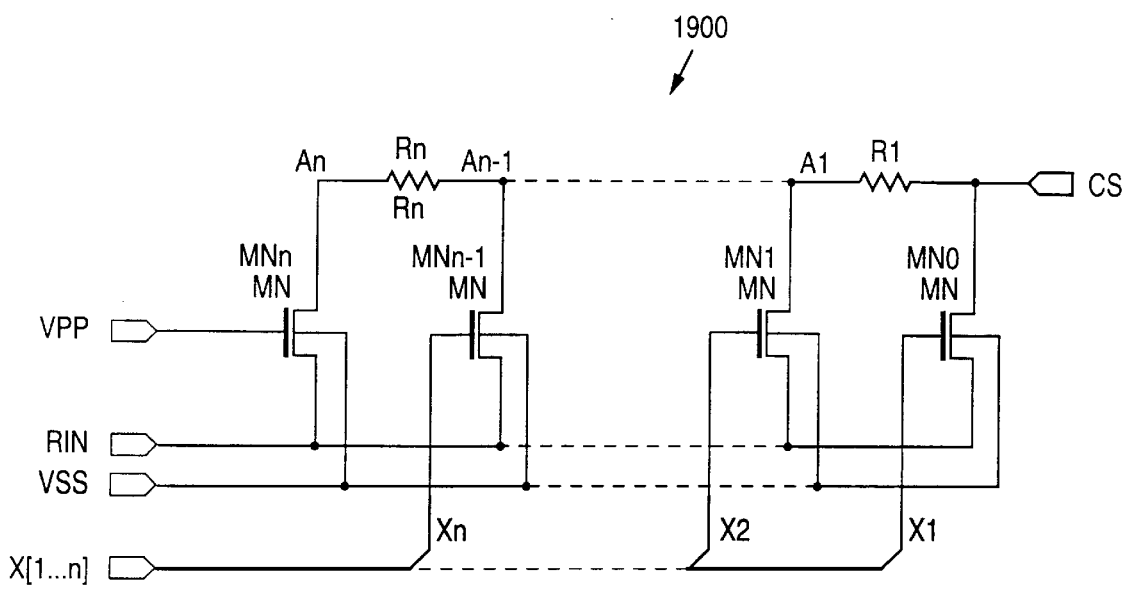
FIG. 19 is a circuit schematic of a preferred embodiment of a resistor ladder that utilizes the outputs of the selector of FIG. 18 to control the switch positions determining the resistance of the resistor ladder.

A preferred resistor ladder circuit 1900 to convert the output of the comparators of selector 1800 into a controlled equivalent resistance is shown in FIG. 19. Although the individual switches MNi of the resistor ladder may comprise a variety of transistor types, they are preferably n-channel MOSFET transistors. It is also desirable to increase the gate voltage of inputs X1, X2, ... XN so that the switches are driven into the ohmic regime. This is preferably achieved using the level shifters 1840 in selector 1800.

Figure 20A:
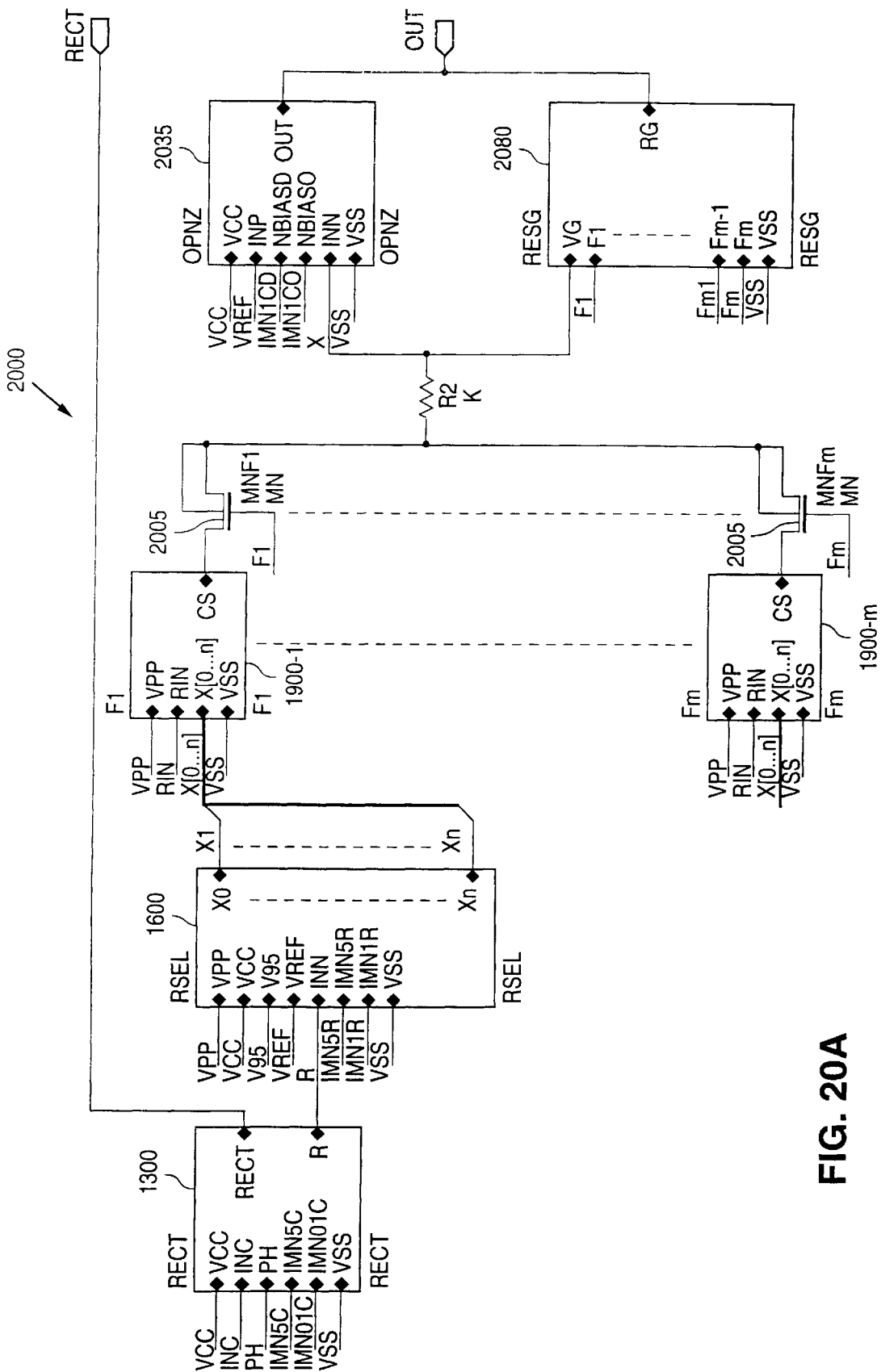
FIG. 20A is a block circuit diagram of a preferred embodiment of the inventive compressor circuit incorporating a switched charging state rectifier and selector circuits to adjust the resistance of resistor ladder circuits comprising part of an op-amp amplifier.

FIG. 20A shows a block diagram circuit schematic of a preferred embodiment of a compression circuit 2000 utilizing a switched resistor ladder 1900-i whose switch positions are determined by selector 1600 acting in response to the rectified output voltage of switched charging state rectifier 1300. As shown in FIG. 20A, another resistive element 2080 is used to provide the feedback conduction path of op-amp feedback amplifier 2035. The trigger voltage of each comparator 1610 comprising selector 1600 is chosen so that selector 1600 selects an appropriate resistance of a resistor ladder 1900 as a function of rectified voltage of switched charging state rectifier 900 to implement a gain compression function.

Figure 20B:
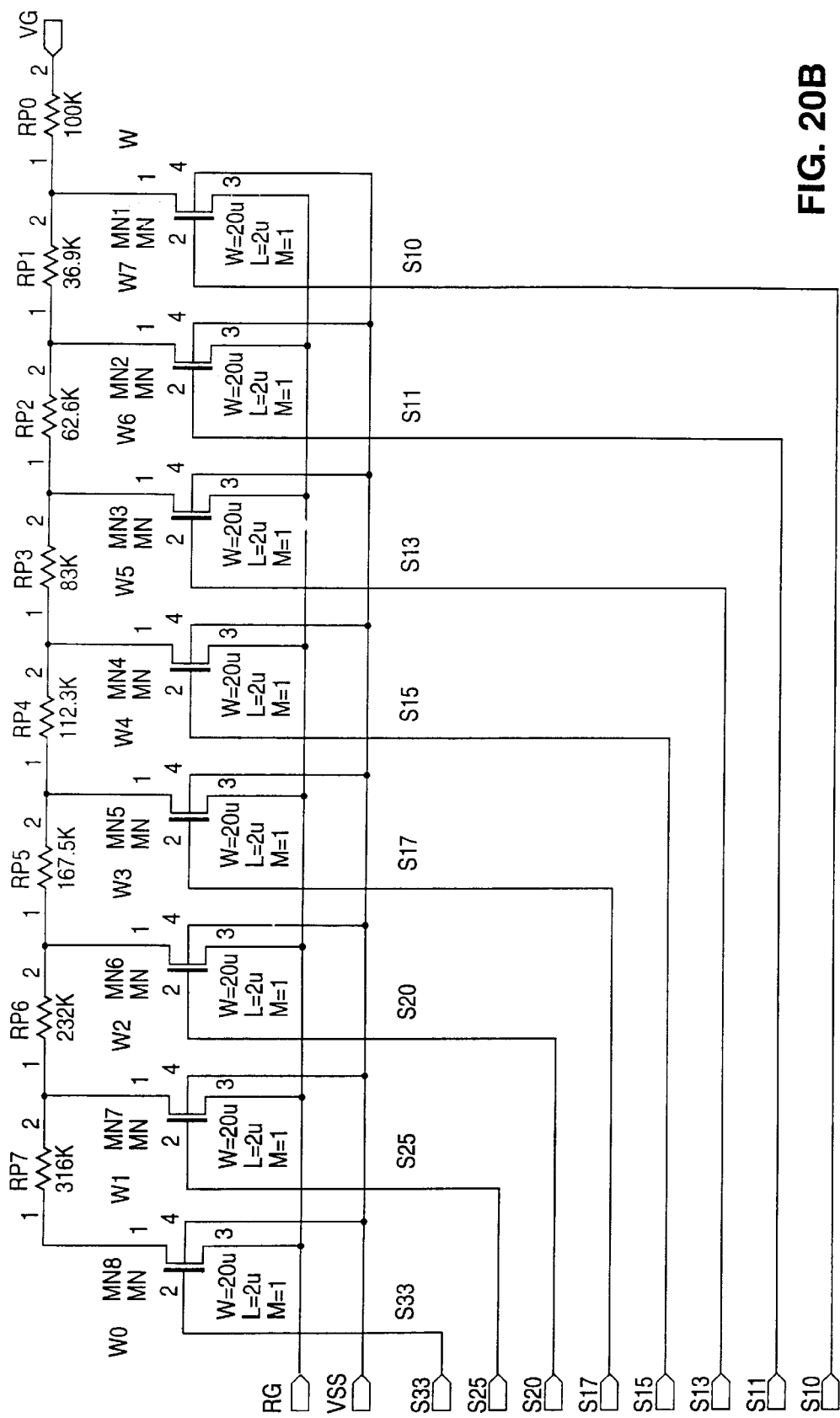
FIG. 20B is a circuit diagram of a preferred adjustable feedback resistor for use in the compressor circuit of FIG. 20A.

In a preferred embodiment one of a plurality of resistor ladders 1900-i may be selected using switches 2005 so that the user may vary the compression ratio. Consequently, it is preferable that resistance element 2080 have a separate resistor for each corresponding resistor ladder 1900-i in order to achieve greater control over the gain compression function. FIG. 20B shows a schematic circuit diagram of a circuit that permits an appropriate feedback resistance to be selected when a particular resistor ladder 1900-i is selected.

Figure 21:
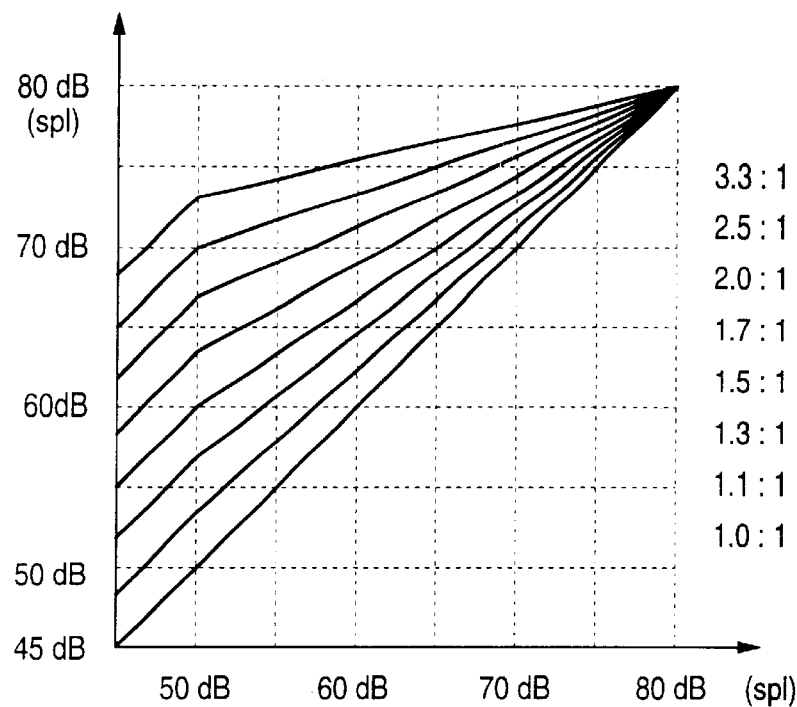
FIG. 21 is a plot showing eight different compression functions that may be achieved using the compressor circuit of FIG. 20A.

FIG. 21 shows representative compression curves for a compression circuit 2000 with a total of seven switched resistor ladders 1900-i and for a constant resistance (no compression). As shown in FIG. 21, a total of eight different compression functions may be selected by switches 2005, although more generally, a plurality of compression ratios/compression functions could be used.

The embodiment of FIG. 20, as indicated in FIG. 21, results in superior control over gain compression compared to conventional low-voltage hearing aid compressors. Although the gain is compressed by varying a resistance in steps, there are a sufficient number of steps that the resulting gain compression function closely approximates a continuous function. The embodiment of FIG. 20 may be implemented as a compact circuit with a plurality of resistor ladders 1900 so that the gain compression ratio may be selected using a switch 2005. The embodiment of FIG. 20 does not require bipolar transistors and does not require expensive DSP elements or large area memory elements for its implementation. It thus provides the benefit of an audio compression function in a compact, comparatively inexpensive circuit. Moreover, the ability to conveniently select different compression ratios is particularly advantageous in those parts of the world where users do not have ready access to an audiologist, such as in many parts of the Third World.

FIGS. 22–26: Preferred Embodiment of Switched Capacitor Compressor

Referring to FIGS. 4–7, another way that the inventive switched charging state rectifier 225 may be used in an audio compressor circuit is if switched charging state rectifier 225 is used to provide a control current $i_c$ which is used to control the impedance of a current-controlled impedance element 260 coupled to an amplifier 235. A variety of current-controlled impedance elements are known in the amplifier art. However, many prior art current-controlled impedances 260 have only a comparatively limited range over which the impedance may be adjusted and/or have a non-linear response. Consequently, it is difficult to fully exploit the benefits of the inventive switched charging state rectifier 220 using conventional current-controlled impedances.

Figure 22:
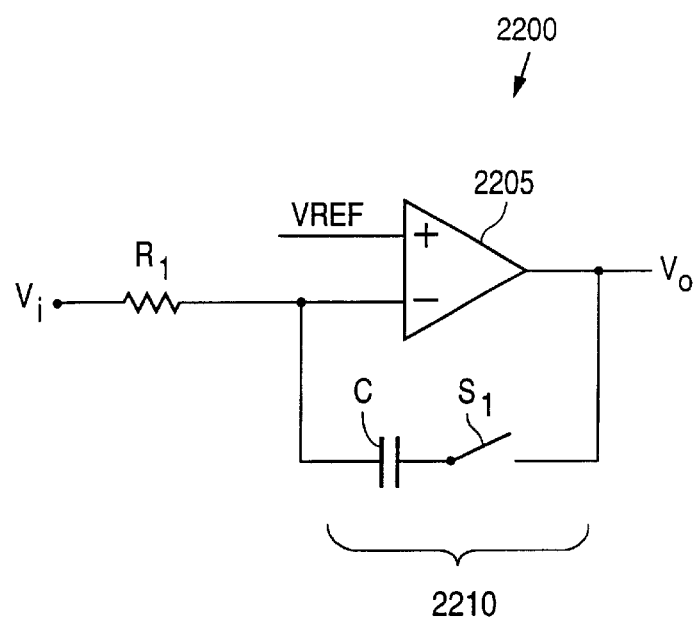
FIG. 22 is an illustrative schematic circuit diagram of a first embodiment of a compressor circuit in which a switched capacitor is used to control the effective resistance of a portion of an op-amp feedback circuit.

As indicated in FIGS. 6–7, the inventor has developed a method to convert a control current into a precisely controlled impedance using a switched capacitor element. As shown in FIG. 22, according to the present invention the input resistance or feedback resistance of an op-amp inverter may be regulated using a switched capacitor element 2210. In the field of switched capacitor circuits, capacitors that are switched on and off at a high frequency (relative to other signals) are often modeled as having an equivalent resistance, $R_{eq}$, given by $R_{eq} = V_{app}/I_{avg}$, where $V_{app}$ is the applied voltage and $I_{avg}$ is the time-averaged current flowing through the switched capacitor. The equivalent resistance for a capacitor switched at a frequency $f_s$ is: $R_{eq}=1/[2f_sC]$. A variety of well-known current-controlled oscillators have a substantial linear relationship between input control current and output frequency. A current-controlled impedance element 260 may be implemented by converting a control current, $i_c$, into a switch control signal with a frequency, $f_s$, utilizing an oscillator 260 in order to adjust the effective resistance of a switched capacitor circuit element.

Figure 23:
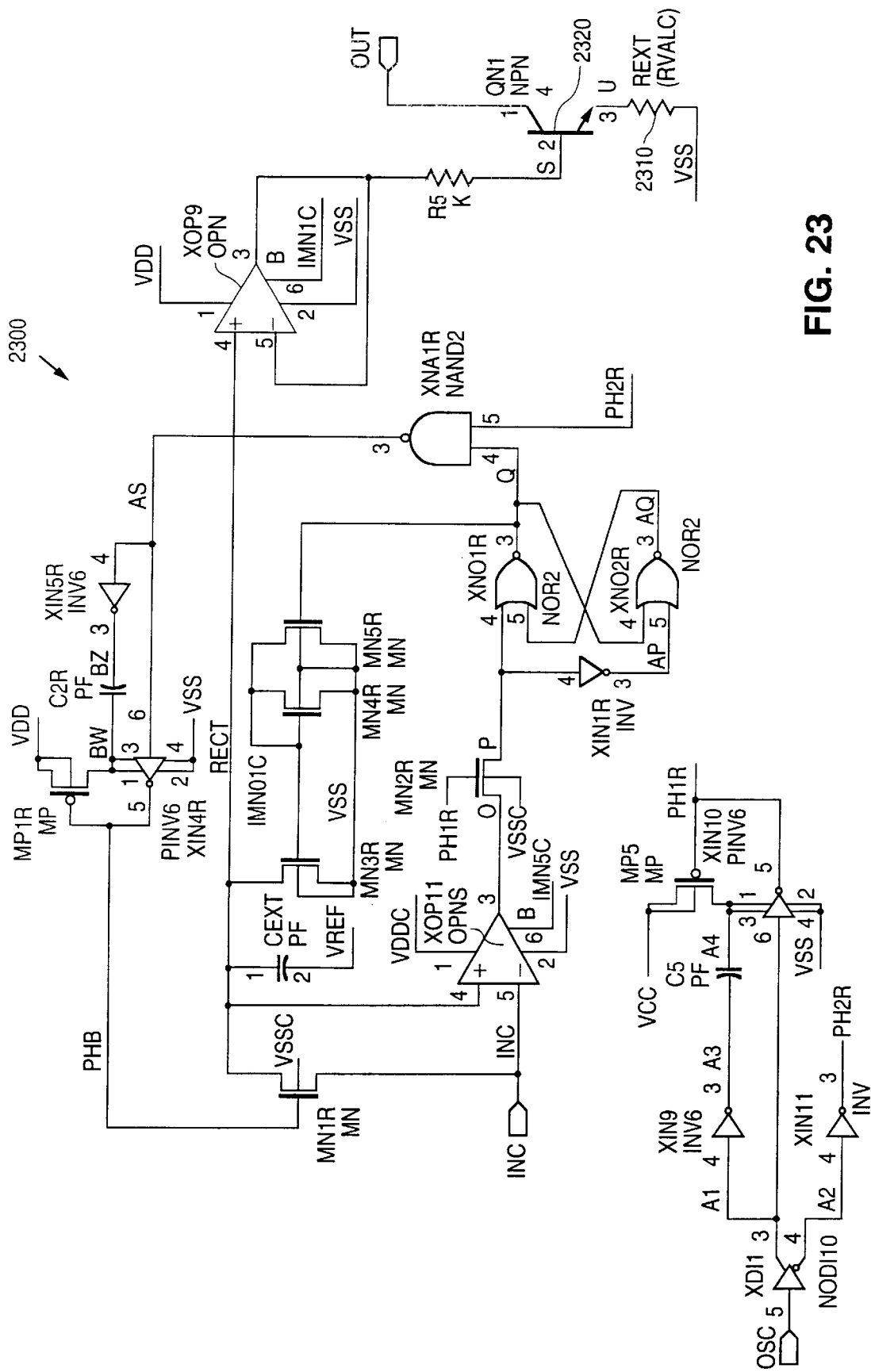
FIG. 23 is a schematic circuit diagram of a bipolar circuit used to control the switch frequency of the switched capacitor of FIG. 22.

As shown in FIG. 23, the output of a switched charging state rectifier may be converted into a control current by coupling the rectified voltage to regulate the base voltage of a bipolar transistor 2320. Changes in the base voltage will, in turn, result in collector-emitter current flowing through resistor 2310 which, to first order, is governed by a well-known exponential dependence on the base voltage. However, a biCMOS process is expensive and has other disadvantages. Consequently, the inventor has a developed a preferred embodiment of a circuit to convert the rectified voltage into a control current.

As indicated in FIGS. 4 and 6, a selector circuit providing control signals to enable current sources 2405 of current matrix 2400 may be used to create a current source in which the output current increases in steps as the rectified voltage 220 increases in a manner selected to achieve a desired compression function.

Figure 24:
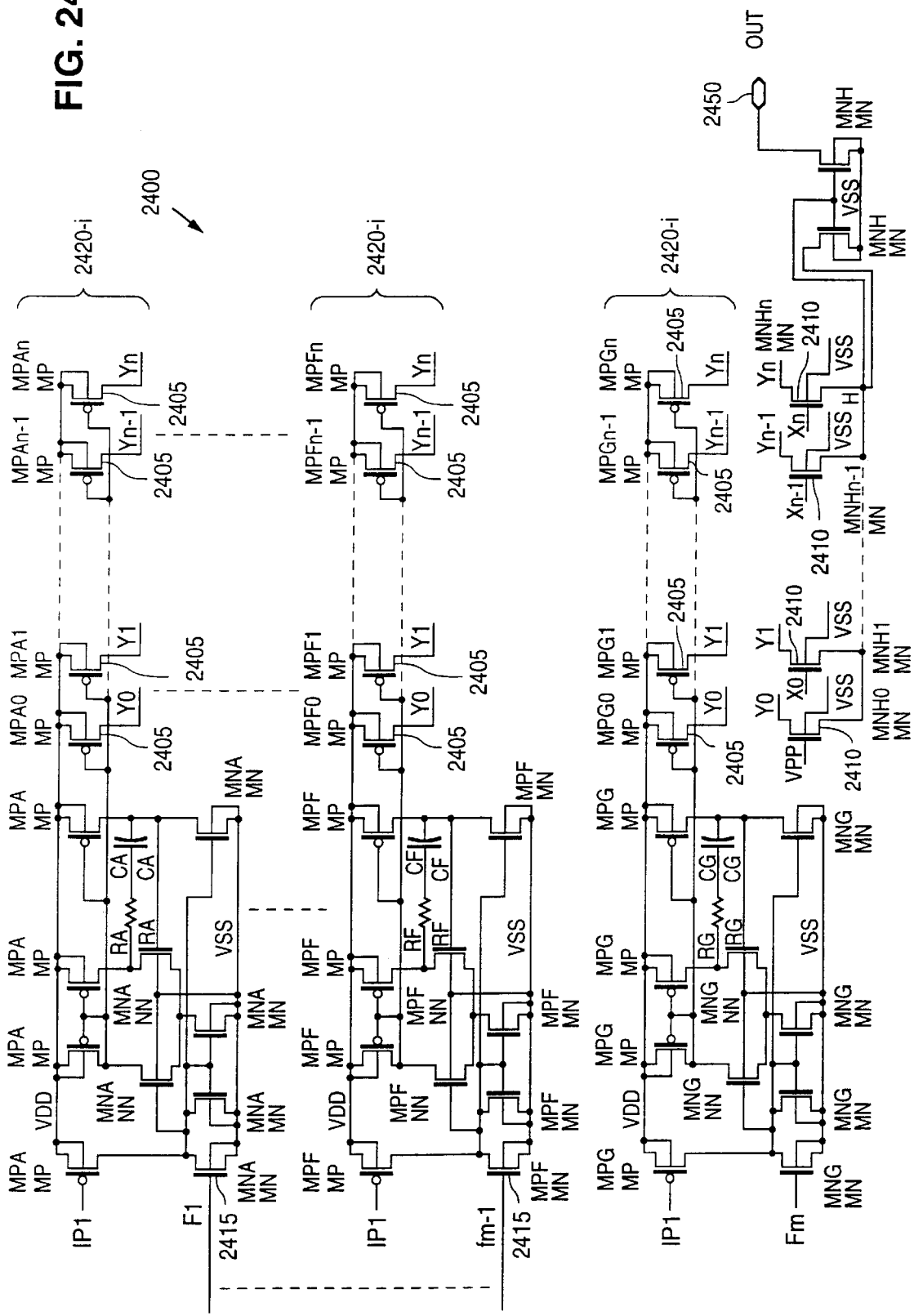
FIG. 24 is a schematic circuit diagram of a selector circuit that converts a rectified voltage into a control current used to control the switch frequency of the switched capacitor of FIG. 22.

FIG. 24 shows a current matrix 2400 in which a plurality of current sources 2405 may be switched on or off by the outputs $X_0 \ldots X_n$ of a selector 1600. As previously described it is desirable that the user be able to select different compression functions. Consequently, signal connections $F_1 \ldots F_{M-1}$ enable switches 2415 to select a compression function by enabling rows of current sources 2420-$i$. Current elements in columns of current sources $y_0 \ldots y_n$ add their current in parallel. Separate switches 2410 turn on/off the currents from columns of current sources 2405 entering output 2450 when the switches are enabled by signals from selector 1600 so that the control current rises in steps to approximate a continuous compression function.

Figure 25:
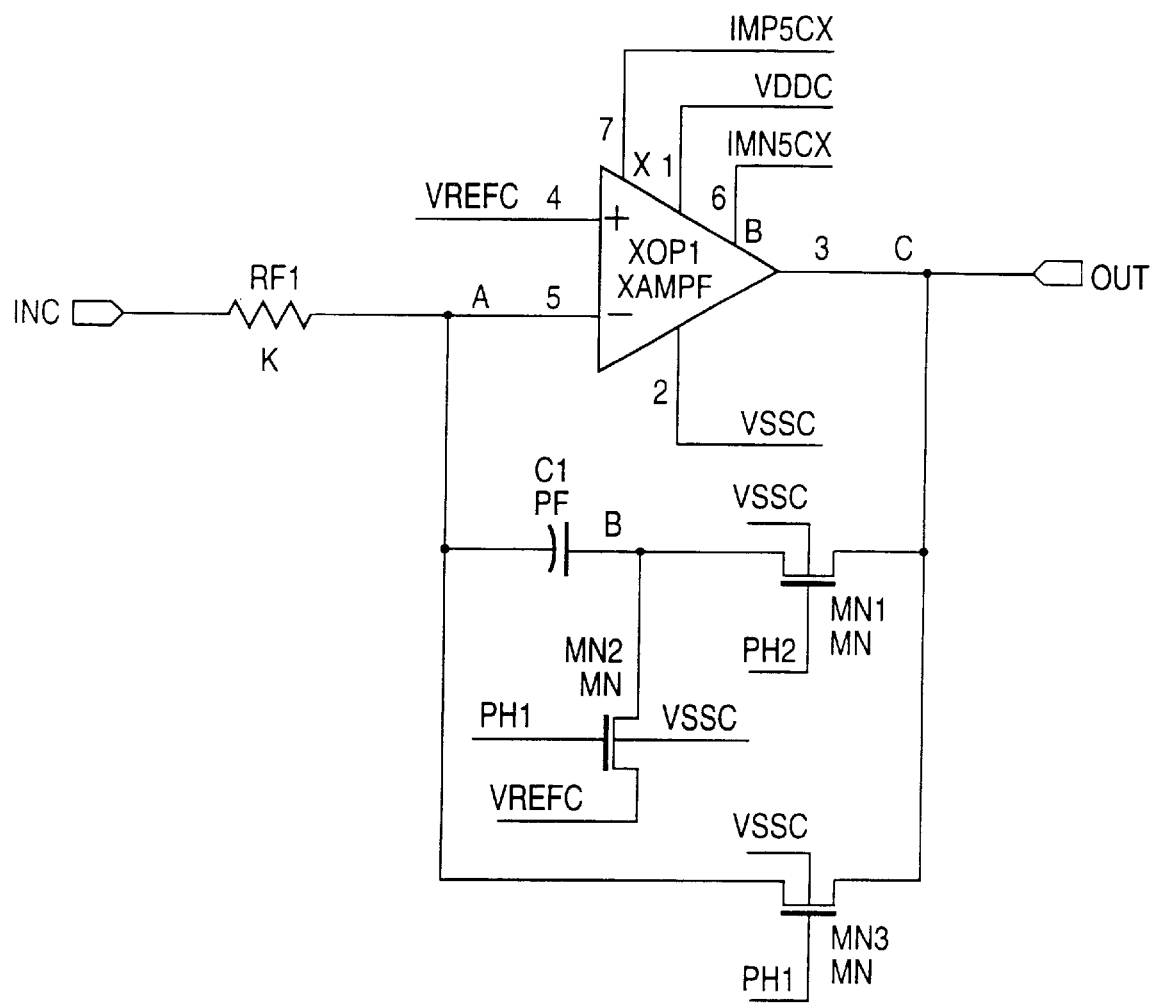
FIG. 25 is a schematic circuit diagram of a preferred embodiment of the switched capacitor amplifier of FIG. 22.
Figure 26A:
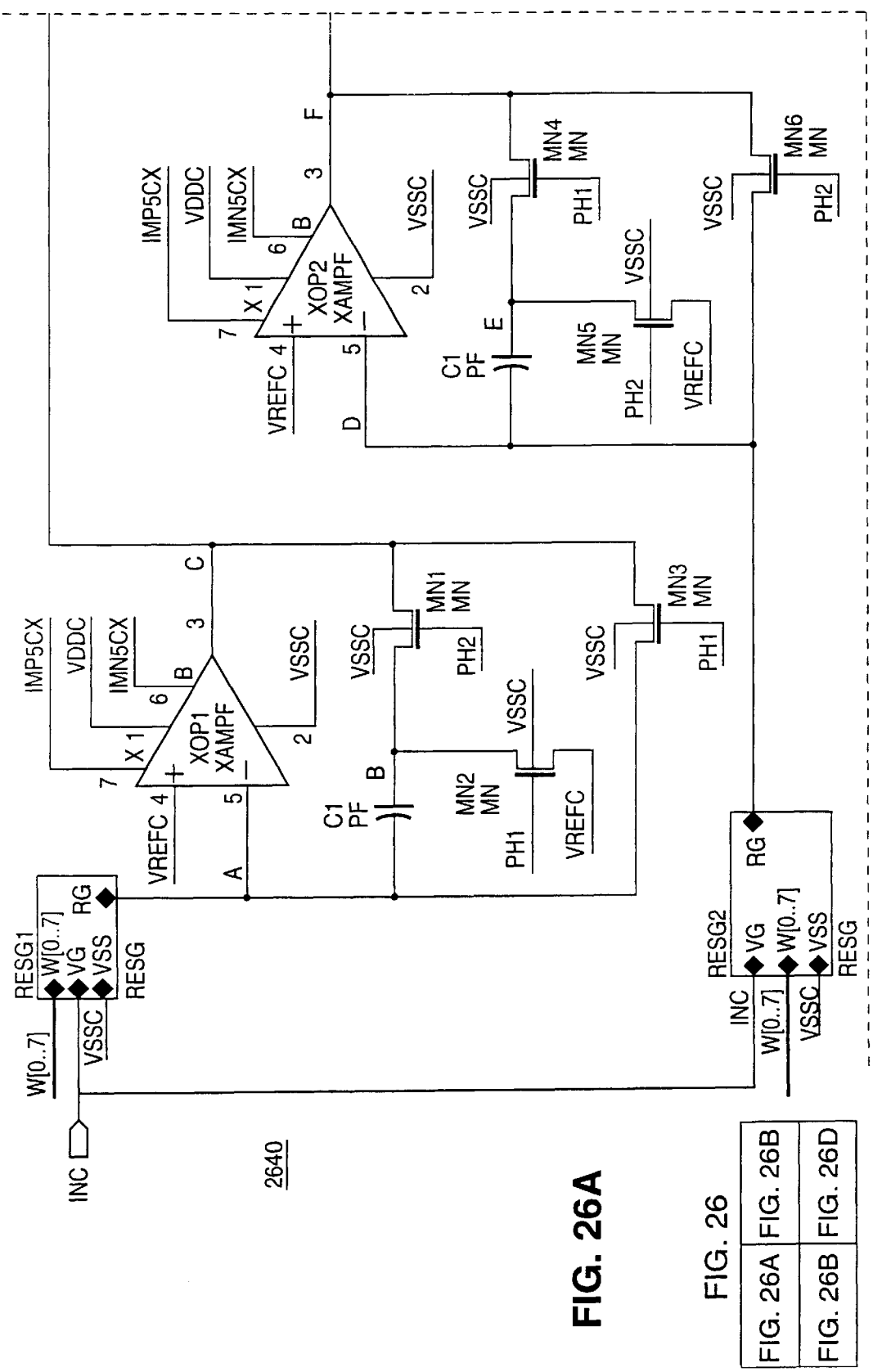
FIGS. 26A–26D are a schematic circuit of a preferred embodiment of a complete audio compressor circuit utilizing switched capacitors.
Figure 26B:
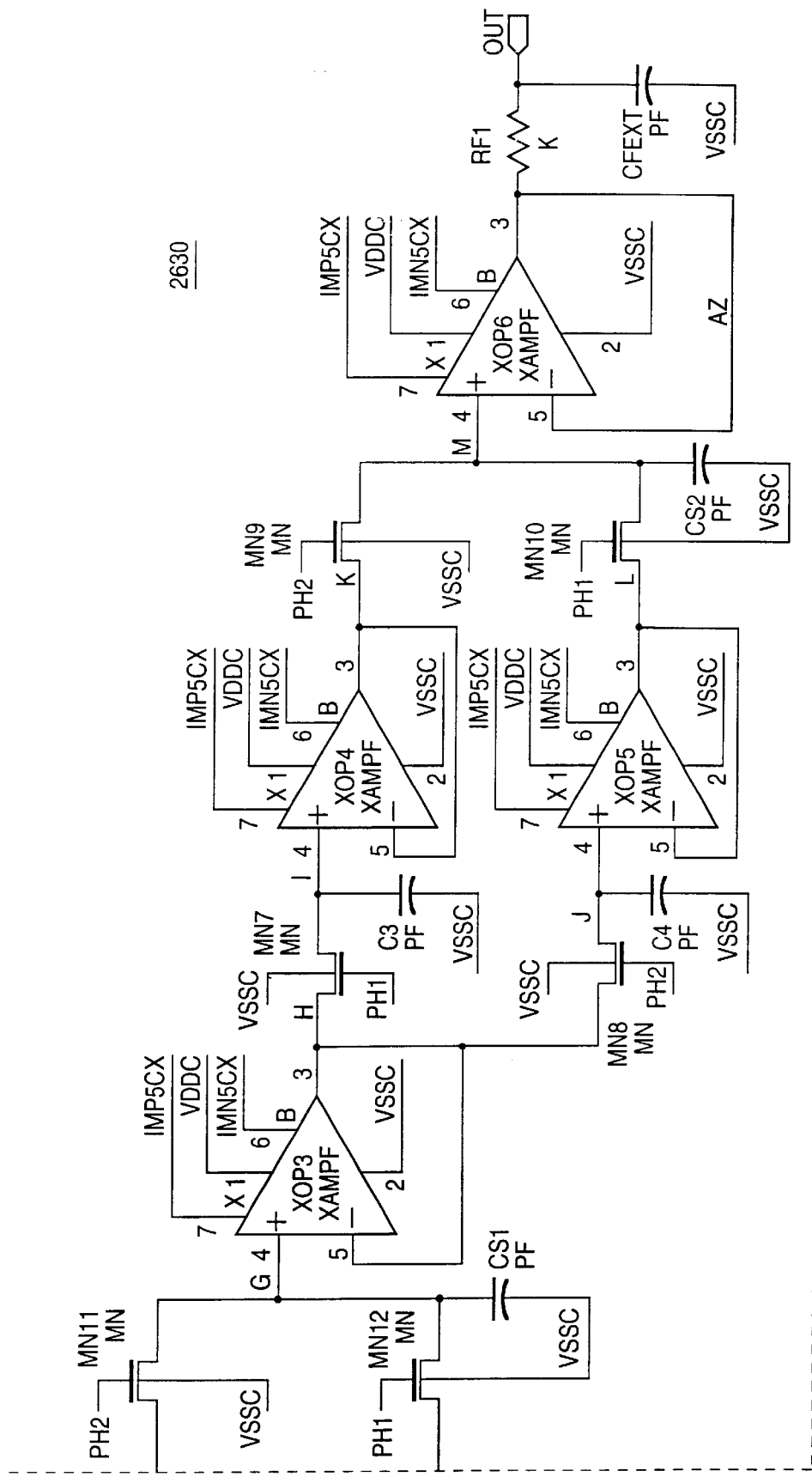
Figure 26C:
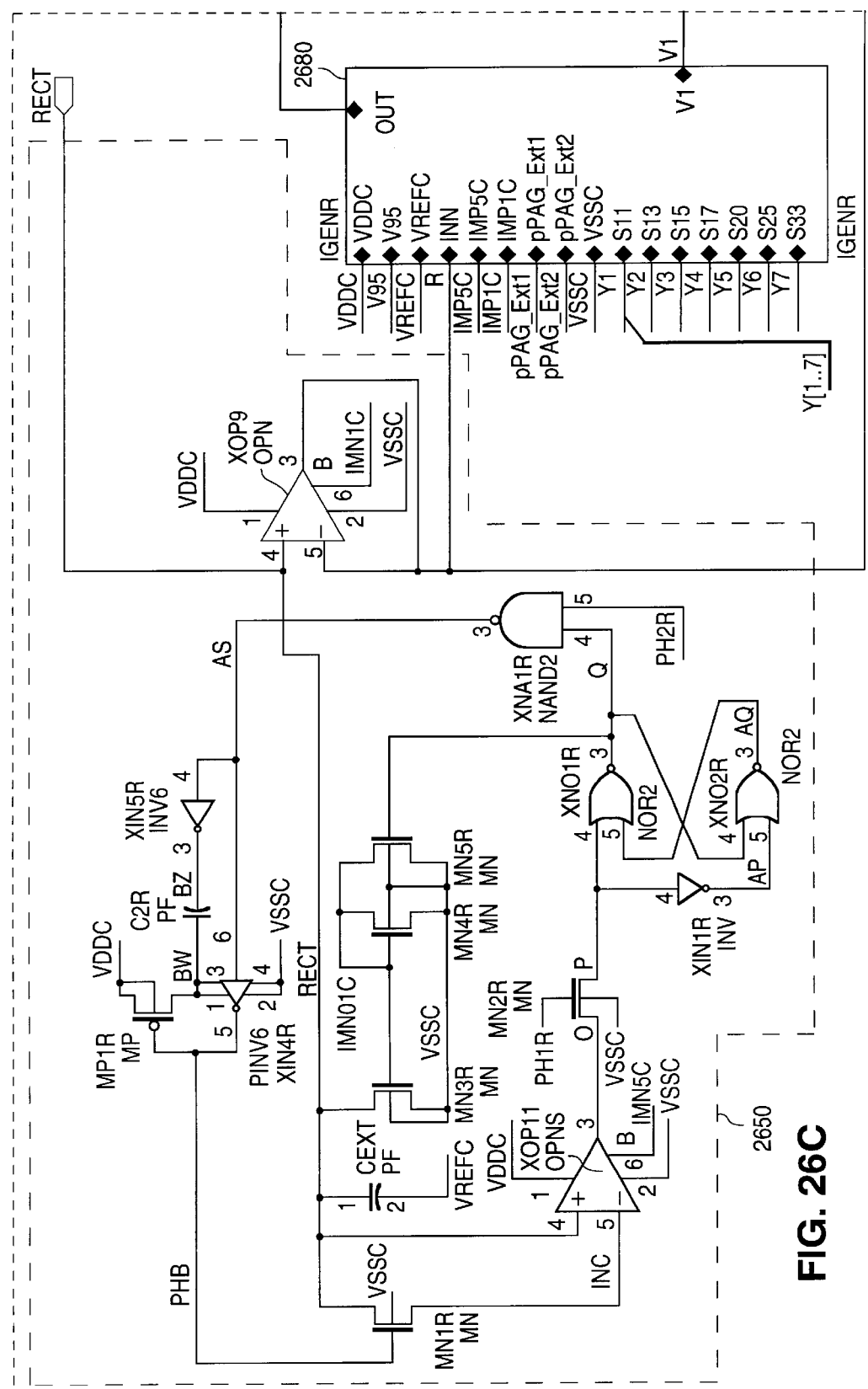
Figure 26D:
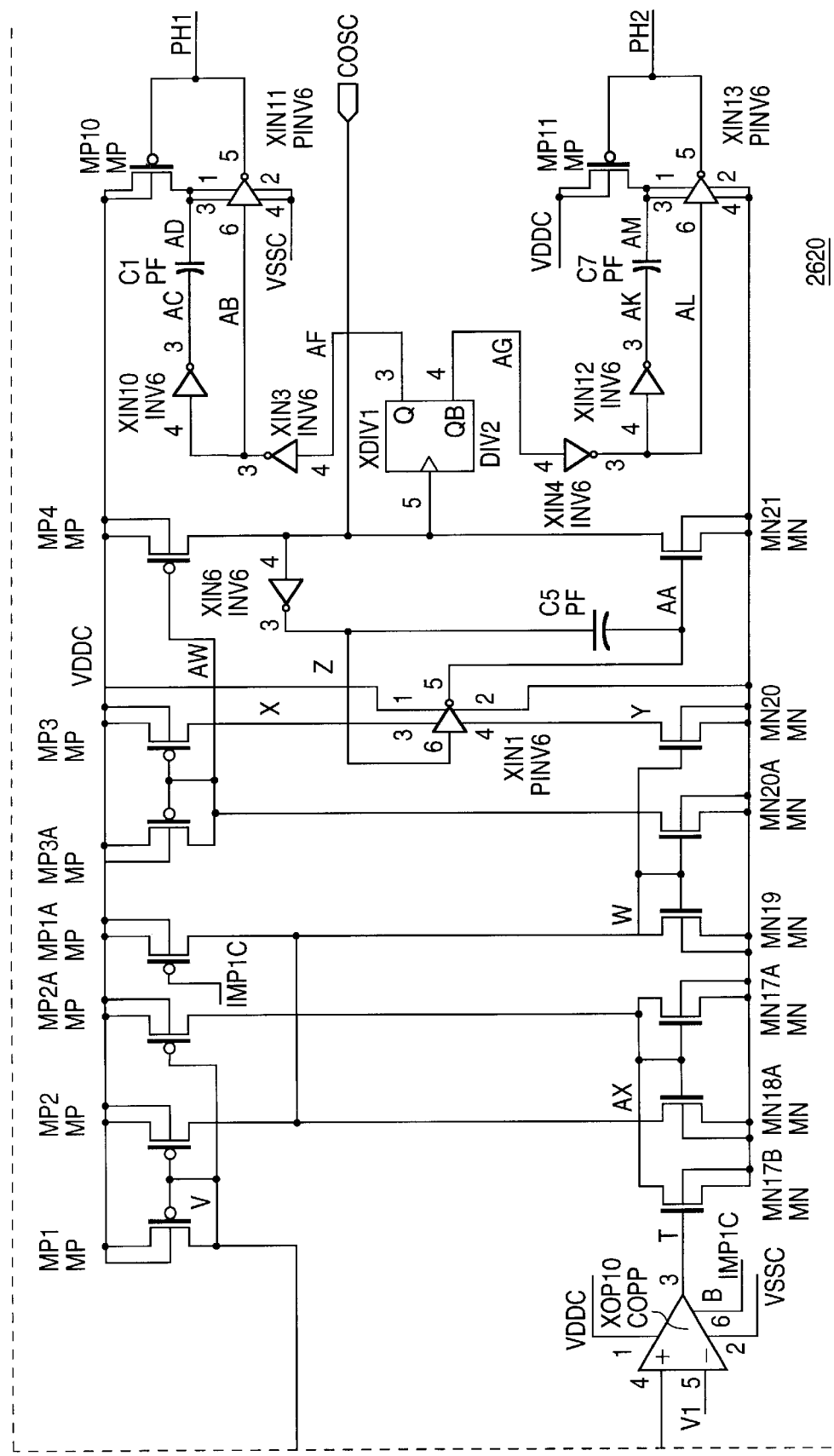

FIG. 25 shows a preferred embodiment of an op-amp amplifier utilizing a switched capacitor and switches to adjust the effective feedback resistance the op-amp 2050. The configuration is similar to those used in conventional switched capacitor filter circuits except that in switched capacitor filter circuits both the input and feedback resistance are regulated with switched capacitor elements. As indicated in FIG. 25, it is desirable to utilize non-overlapping clock signals PH1 and PH2 to control the charge injection on capacitor C1 in a manner similar to that utilized in switched capacitor filter circuits.

FIG. 26 is a block circuit diagram of a preferred embodiment of a complete audio compressor based upon using the rectified voltage 220 of a switched charging state rectifier 225 is used to control the frequency at which the switched capacitor of an op-amp feedback amplifier switches. The circuit includes a preferred oscillator. In addition, a sample and hold filter circuit is used to filter out the high-frequency signal components introduced by the switched capacitor oscillator. As shown in FIG. 26, the output of a switched charging state rectifier 2650 is input to a combined selector and current generator 2680. The output current of combined selector and current generator 2680 is input to a current-controlled oscillator 2620. Oscillator 2620 determines the switching frequency of switched capacitor elements in amplifier 2640, thereby reducing the gain of amplifier 2640 in accord with a compression function. A conventional sample and hold filter 2630 is used to filter out high-frequency signal component of amplifier 2640 created by the switched capacitor elements.

Alternate Digital Circuit Embodiments

Referring again to FIGS. 2A–2B, it will be understood that the function of rectifier 100 and impedance controller 110 may be implemented in other ways as well. For example, impedance controller 110 may be implemented as any digital circuit which converts a rectified voltage into an impedance that is a stepwise function of a rectified voltage. Rectifier 100 may also be implemented using any conventional digital circuit or via any known digital signal processing method. Moreover, it will be understood that the function of both rectifier 100 and impedance controller 110 may be combined in a single digital circuit. In particular, it will be understood that the rapid advances in low voltage digital signal processors (DSP) permit some or all of the functions of rectifier 100, controller 110, and amplifier 120 to be implemented via a digital signal processor.

In summary, the inventive audio compressor comprises a switched charging state rectifier and an impedance control circuit which are used to regulate the gain of an amplifier to achieve a desired compression function. The switched charging state rectifier provides a rectified output with a controlled transient response which corresponds to an attack/release function. In a preferred embodiment, the rectified output of the switched charging state rectifier is fed into a selector. The selector preferably comprises a plurality of comparators, each of which has its trigger voltage set by a resistive voltage divider. The outputs of the comparators of the selector are preferably used to control the switch positions of a resistor ladder. The resistor ladder preferably forms one of the resistors of an op-amp feedback amplifier circuit. Appropriate selection of the trigger voltages of each comparator of the selector permits the resistance of the resistor ladder to increase with increasing magnitude of the input signal so that the gain of the amplifier approximates a desired compression function.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A compressor circuit, comprising:

an input node for receiving an input signal;

an output node for outputting an output signal;

a rectifier coupled to said input node and producing a rectified voltage proportional to the magnitude of said input signal; and an impedance controller configured to produce an impedance that is a stepwise function of said rectified voltage;

an amplifier for amplifying said input signal, said amplifier having a gain at said output node that is a function of said impedance and where said stepwise function is selected to have sufficient number of steps so that the output of the amplifier is a piecewise approximation of a continuous compression function.

2. The compressor circuit of claim 1, wherein said rectifier is configured so that said rectified voltage has a preselected transient response to changes in the magnitude of said input signal.

3. The compressor circuit of claim 1, wherein said impedance controller comprises:

a selector to convert said rectified voltage into a plurality of switch control signals; and a switched resistor ladder to convert said switch control signals into a resistance.

4. The compressor circuit of claim 3, wherein said selector comprises a plurality of comparators comparing the rectified voltage to a plurality of reference voltages.

5. The compressor circuit of claim 3, wherein said selector comprises a plurality of comparators configured to compare said rectified voltage to a plurality of reference voltages of a resistor chain forming a voltage divider.

6. The compressor circuit of claim 1, wherein said impedance controller comprises:
   a selector to convert said rectified voltage into a plurality of switch control signals;
   a current matrix configured to convert said control signals into a control current;
   a current-controlled oscillator producing a variable frequency output in response to the control current; and
   a switched capacitor element wherein the switching rate of said switched capacitor is determined by said variable frequency output;
   whereby the effective resistance of said switched capacitor element is a stepwise function of said rectified voltage.

7. The compressor circuit of claim 1, wherein said rectifier is a switched charging state rectifier, said switched charging rectifier including:
   a capacitor;
   a charging switch coupling said capacitor to a charging node;
   a discharge switch coupling said capacitor to a discharge node;
   a switch controller configured to operate said switches so that said capacitor is charged when the voltage on said capacitor is less than the magnitude of an input voltage and discharged when the voltage on said capacitor is greater than the magnitude of the input voltage; and
   a current limiting element coupled to the discharging current path to limit the rate at which current may be discharged.

8. The compressor circuit of claim 3, wherein said rectifier is a switched charging state rectifier, said switched charging rectifier including:
   a capacitor;
   a charging switch coupling said capacitor to a charging node;
   a discharge switch coupling said capacitor to a discharge node;
   a switch controller configured to operate said switches so that said capacitor is charged when the voltage on said capacitor is less than the magnitude of an input voltage and discharged when the voltage on said capacitor is greater than the magnitude of the input voltage; and
   a current limiting element coupled to the discharging current path to limit the rate at which current may be discharged.

9. The compressor circuit of claim 6, wherein said rectifier is a switched charging state rectifier, said switched charging rectifier including:
   a capacitor;
   a charging switch coupling said capacitor to a charging node;
   a discharge switch coupling said capacitor to a discharge node;
   a switch controller configured to operate said switches so that said capacitor is charged when the voltage on said capacitor is less than the magnitude of an input voltage and discharged when the voltage on said capacitor is greater than the magnitude of the input voltage; and
   a current limiting element coupled to the discharging current path to limit the rate at which current may be discharged.

10. A compressor circuit, comprising:
    an amplifier;
    a switched charging state rectifier producing an rectified voltage that is a function of the magnitude of an input signal with a controlled transient response, said switched charging rectifier including:
       a capacitor;
       a charging switch coupling said capacitor to a charging node;
       a discharge switch coupling said capacitor to a discharge node;
       a switch controller configured to operate said switches so that said capacitor is charged when the voltage on said capacitor is less than the magnitude of an input voltage and discharged when the voltage on said capacitor is greater than the magnitude of the input voltage; and
       a current limiting element coupled to the discharging current path to limit the rate at which current may be discharged; and
    an impedance controller receiving as an input the rectified voltage of said switched charging state rectifier and providing a controlled impedance coupled to said amplifier to regulate the amplifier gain according to a stepwise compression function;
    wherein the capacitance of said capacitance and the electrical characteristics of said current limiting element are selected so that said compressor circuit has a preselected release time.

11. The compressor circuit of claim 10, wherein said impedance control circuit comprises: a selector receiving as an input the rectified voltage and producing logical control signals coupled to a plurality of switches of a resistance ladder to adjust the resistance of the resistance ladder as a function of the rectified voltage of said switched charging state rectifier.

12. The compressor circuit of claim 11, wherein said selector comprises a plurality of comparators configured to compare the rectified voltage of said switched charging state rectifier to a plurality of reference voltages of a resistor chain forming a voltage divider.

13. The compressor circuit of claim 10, wherein said impedance control circuit comprises a selector receiving as an input the rectified voltage and producing logical control signals coupled to a plurality of current sources connected as a current matrix with a common output control current, said logical control signals adjusting the output control current of said current matrix as a function of the rectified voltage of said switched charging state rectifier.

14. The compressor circuit of claim 12, wherein said control current is input to a current-to-frequency oscillator to produce switch control signals that are coupled to a switched-capacitor element.

15. The compressor circuit of claim 14, wherein said selector comprises a plurality of comparators comparing the output voltage of said switched charging state rectifier to a plurality of reference voltages.

16. The compressor circuit of claim 10, wherein said impedance control circuit comprises: a bipolar transistor receiving as a base-emitter control voltage the rectified voltage and having as an output an emitter-collector control current, a current a current-to-frequency oscillator producing switch control signals as a function of the control current; and a switched-capacitor element receiving said switch control signals.

17. A compressor circuit, comprising:

an amplifier;

a switched charging state rectifier producing an rectified voltage that is a function of the magnitude of an input signal with a controlled transient response, said switched charging rectifier comprising:

a capacitor;

a charging switch coupling said capacitor to a charging node;

a discharge switch coupling said capacitor to a current sink;

a switch controller adjusting the operation of said switches so that said capacitor is charged when the voltage on said capacitor is less than the magnitude of an input voltage and discharged when the voltage on said capacitor is greater than the magnitude of the input voltage; and a selector circuit for converting the output of said switched charging state rectifier into switch control signals; and a switched resistor ladder electrically coupled to said amplifier to regulate the amplifier gain, said switching resistor ladder having a plurality of switches for controlling the resistance of said resistor ladder;

wherein said selector circuit provides control signals which select the resistance of said resistor ladder as a function of the input signal level.

18. The compressor circuit of claim 17, wherein said selector comprises a plurality of comparators each receiving as an input a voltage corresponding to the output of said switched charging state rectifier and each having a reference voltage determined by a resistive voltage divider.

19. The compressor circuit of claim 18, wherein the resistors of said resistive voltage divider are selected to adjust the trigger voltage of each said comparator in accord with a compression function.

20. The compressor circuit of claim 17, wherein current sink comprises a current mirror.

21. The compressor circuit of claim 17, wherein said charging current node couples said capacitor to an input signal node so that said capacitor is coupled to said signal by said charging switch.

22. The compressor circuit of claim 17, wherein said charging current node couples said capacitor to a charging current source.

23. The compressor circuit of claim 22, wherein said charging current source comprises a current mirror.

24. A method of compressing an audio input signal, comprising the steps of:

generating a rectified voltage from said input signal having a preselected attack and release function; and compressing the input signal as a pre-selected stepwise function of said rectified voltage;

wherein said stepwise function is selected so that the compression is a piecewise approximation of a continuous compression function.

25. The method of claim 24, wherein a digital signal processor is used to generate said rectified voltage.

26. A method of compressing an audio input signal, comprising the steps of:

rectifying said input signal to produce a rectified voltage;

generating an impedance which is a stepwise function of the magnitude of said rectified voltage; and compressing the input signal as a pre-selected function of said impedance;

wherein said stepwise function is selected so that the compression is a piecewise approximation of a continuous compression function.

27. The method of claim 26, further including the step of: selecting said stepwise function so that the compression function changes as a function of the magnitude of the input signal in steps of about one dB or less.

28. The method of claim 26, wherein the input signal is compressed as a linear function of said impedance.

29. The method of claim 26, wherein said step of rectification includes converting the rectified voltage into an output having a preselected attack response.

30. The method of claim 26, wherein said step of rectification includes converting the rectified voltage into an output having a preselected release response.

* * * * *